(12) United States Patent
Yang et al.

(10) Patent No.: US 10,468,464 B2
(45) Date of Patent: Nov. 5, 2019

(54) DISPLAY PANEL AND DISPLAY DEVICE

(71) Applicant: SHANGHAI TIANMA MICRO-ELECTRONICS CO., LTD., Shanghai (CN)

(72) Inventors: Kang Yang, Shanghai (CN); Lihua Wang, Shanghai (CN); Qijun Yao, Shanghai (CN); Yang Zeng, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 184 days.

(21) Appl. No.: 15/717,870

(22) Filed: Sep. 27, 2017

(65) Prior Publication Data
US 2018/0019288 A1    Jan. 18, 2018

(30) Foreign Application Priority Data

May 27, 2017    (CN) .......................... 2017 1 0392436

(51) Int. Cl.
*H01L 27/32* (2006.01)
*H01L 31/105* (2006.01)
(Continued)

(52) U.S. Cl.
CPC ........ *H01L 27/3227* (2013.01); *G06F 3/0412* (2013.01); *G06K 9/0004* (2013.01);
(Continued)

(58) Field of Classification Search
CPC ................. G06K 9/00; G06K 19/0718; G06K 19/07354; G06K 9/209; G06K 9/0004;
(Continued)

(56) References Cited

U.S. PATENT DOCUMENTS

| | | | |
|---|---|---|---|
| 8,803,151 B2* | 8/2014 | Okajima | G02F 1/1368 257/59 |
| 2008/0042553 A1* | 2/2008 | Li | H01L 51/5281 313/501 |

(Continued)

FOREIGN PATENT DOCUMENTS

| | | |
|---|---|---|
| CN | 102859693 A | 1/2013 |
| CN | 106169484 A | 11/2016 |

*Primary Examiner* — Bobbak Safaipour
(74) *Attorney, Agent, or Firm* — Kilpatrick Townsend & Stockton, LLP

(57) ABSTRACT

Disclosed are a display panel and a display device, the display panel includes: an array substrate, which includes a base substrate and a display drive circuit on the base substrate; a display unit, which is provided on the array substrate and located on one side of the display drive circuit that is facing away from the base substrate; and a fingerprint identification unit, which includes a light-sensing unit, wherein the light-sensing unit is provided on the array substrate and located on one side of the display drive circuit that is facing away from the base substrate, and a vertical projection of the light-sensing unit on a plane including a light-emitting functional layer of the display unit is located between short edges of the light-emitting functional layers of adjacent display units.

14 Claims, 41 Drawing Sheets

(51) Int. Cl.
*G06K 9/00* (2006.01)
*G06K 9/20* (2006.01)
*H01L 31/153* (2006.01)
*H01L 27/12* (2006.01)
*G06F 3/041* (2006.01)
*G09G 3/3225* (2016.01)

(52) U.S. Cl.
CPC .......... *G06K 9/209* (2013.01); *H01L 27/1255* (2013.01); *H01L 27/323* (2013.01); *H01L 31/105* (2013.01); *H01L 31/153* (2013.01); *G09G 3/3225* (2013.01)

(58) Field of Classification Search
CPC ................. G06F 21/32; G06F 17/3074; G06F 17/30784; G06F 3/0412; H01L 27/3227; H01L 27/3234; H01L 27/1255; H01L 31/105; H01L 31/153; H01L 27/323; H01L 51/525; G09G 3/3225
See application file for complete search history.

(56) References Cited

U.S. PATENT DOCUMENTS

| | | | |
|---|---|---|---|
| 2011/0148781 A1* | 6/2011 | Chen | G06F 3/0412 345/173 |
| 2017/0045995 A1* | 2/2017 | Zhao | G06F 3/044 |
| 2017/0115818 A1* | 4/2017 | Cai | G06F 3/044 |
| 2017/0206395 A1* | 7/2017 | Chang | G06K 9/00087 |
| 2018/0033835 A1* | 2/2018 | Zeng | G06F 3/0412 |
| 2018/0040675 A1* | 2/2018 | Zeng | G06F 3/0416 |
| 2018/0348925 A1* | 12/2018 | Wang | G06F 3/041 |

* cited by examiner

DISPLAY PANEL AND DISPLAY DEVICE

CROSS-REFERENCE TO RELATED APPLICATIONS

This application claims priority to Chinese Patent Application No. 201710392436.3, filed on May 27, 2017 and entitled "DISPLAY PANEL AND DISPLAY DEVICE", the disclosure of which is incorporated herein by reference in its entirety.

TECHNICAL FIELD

The present disclosure relates to display technologies, and in particular, to a display panel and a display device.

BACKGROUND

Fingerprint is inherent and unique for everyone. With the development of sciences and technologies, there are various display devices with a fingerprint identification function on the market, for example, mobile phones, tablet computers and intelligent wearable devices, etc. Thus, before operating a display device with a fingerprint identification function, a user may perform authority verification by only touching a fingerprint identification sensor of the display device using a finger, and hence the authority verification process may be simplified.

In the existing display devices, the fingerprint identification sensor is directly provided in a display region of the display panel. Because a part of the light emitted by the display unit in the display region of the display panel will directly irradiate on the fingerprint identification unit, noise may be formed, so that the precision of fingerprint identification of the fingerprint identification unit may be influenced.

SUMMARY

The present disclosure provides a display panel and a display device, thereby reducing the affection of light emitted by the display unit on the fingerprint identification unit and improving the precision of fingerprint identification.

In a first aspect, the present disclosure provides a display panel, which includes: an array substrate, which includes a base substrate and a display drive circuit formed on the base substrate; a display unit, which is provided on the array substrate and located on one side of the display drive circuit that is facing away from the base substrate; and a fingerprint identification unit, which includes a light-sensing unit, wherein the light-sensing unit is provided on the array substrate and located on one side of the display drive circuit that is facing away from the base substrate, and a vertical projection of the light-sensing unit on a plane including a light-emitting functional layer of the display unit is located between short edges of the light-emitting functional layers of adjacent display units.

In a second aspect, the present disclosure further provides a display device, which includes the display panel according to any embodiment of the disclosure.

In the embodiments of the disclosure, a vertical projection of the light-sensing unit on a plane including a light-emitting functional layer of the display unit is located between short edges of the light-emitting functional layers of adjacent display units. Since the short edge of the light-emitting functional layer emits little lateral light, the light irradiated by the display unit on the light-sensing unit can be reduced, so that the affection of the light emitted by the display unit on the light-sensing unit can be reduced, thereby improving the precision of fingerprint identification.

DETAILED DESCRIPTION

The application will be illustrated in detail in conjunction with the drawings and embodiments. It may be understood that, the embodiments described here are only provided for explaining, rather than limiting, the application. Additionally, it further needs to be noted that, for convenient description, the drawings only show the parts related to the application, rather than the whole structure.

Figure 1A:
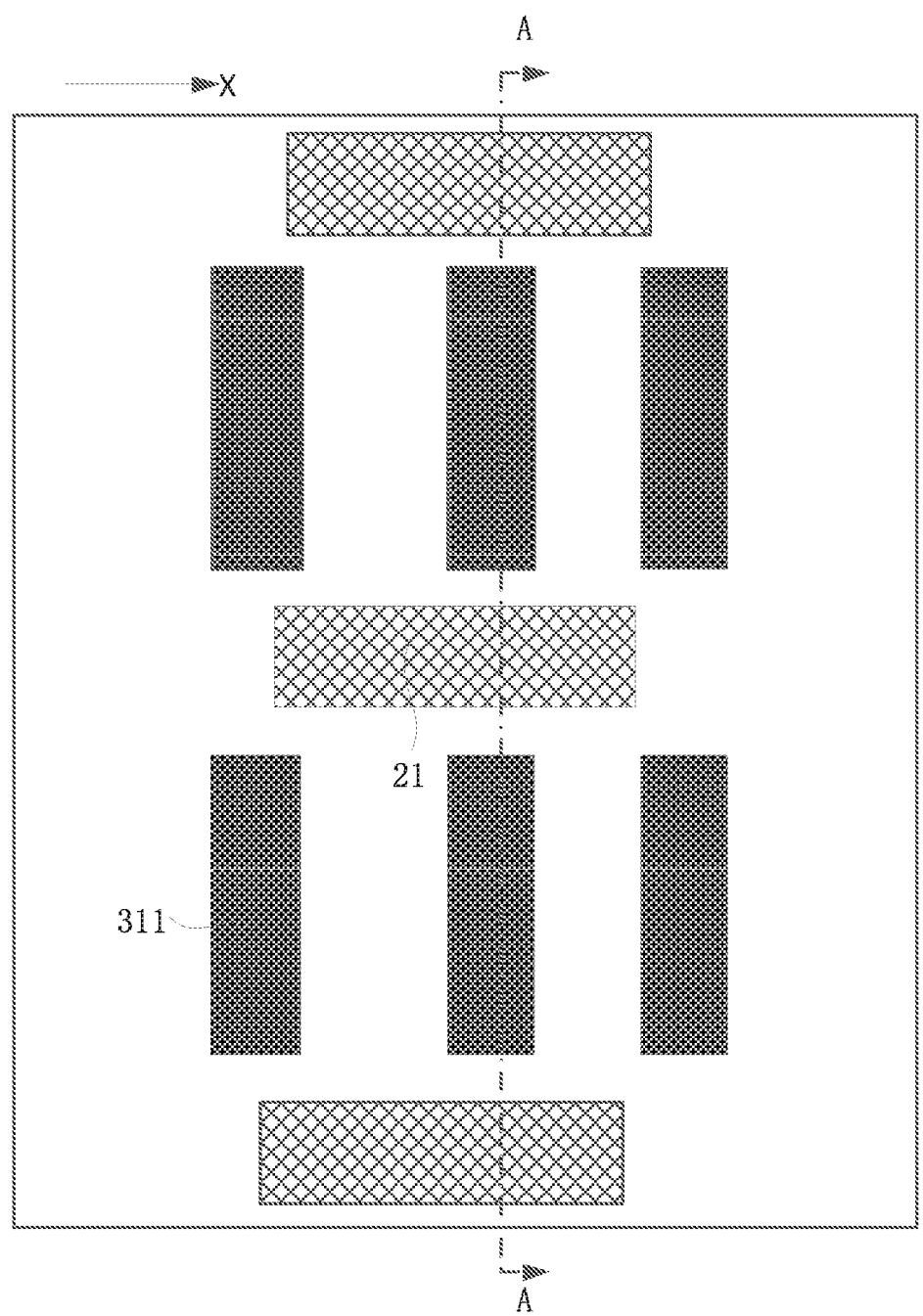
FIG. 1A is a schematic plan view of a display panel according to an embodiment of the disclosure.
Figure 1B:
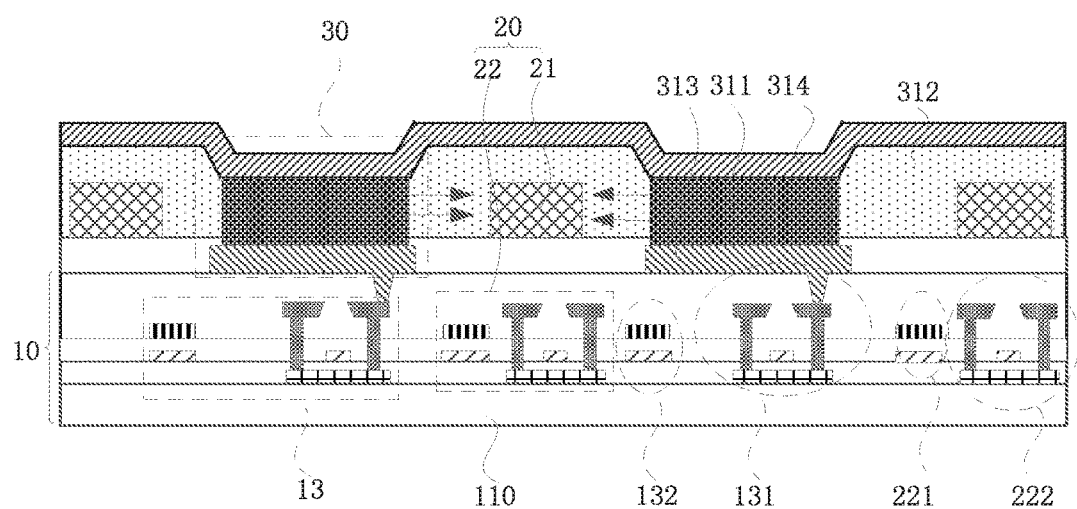
FIG. 1B is a schematic sectional view taking along section line A-A of the display panel in FIG. 1A.

This embodiment provides a display panel. FIG. 1A is a schematic plan view of a display panel according to an embodiment of the disclosure, and FIG. 1B is a schematic sectional view taking along section line A-A of the display panel in FIG. 1A. Referring to FIG. 1A and FIG. 1B, the display panel includes:

an array substrate 10, which includes a base substrate 110 and a display drive circuit 13 formed on the base substrate 110;

a display unit 30, which is provided on the array substrate 10 and located on one side of the display drive circuit 13 which is facing away from the base substrate 110; and a fingerprint identification unit 20, which includes a light-sensing unit 21, wherein the light-sensing unit 21 is provided on the array substrate 10 and located on one side of the display drive circuit 13 that is facing away from the base substrate 110, and a vertical projection of the light-sensing unit 21 on a plane including a light-emitting functional layer 311 of the display unit 30 is located between short edges of the light-emitting functional layers 311 of adjacent display units 30.

Specifically, the light-sensing unit 21 is a part in the fingerprint identification unit 20 that receives a light signal, and it is configured to convert the light reflected by a fingerprint into an electrical signal. Exemplarily, the light-sensing unit 21 may be a photosensitive diode. Additionally, the short edge of the light-emitting functional layer 311 refers to an edge of the light-emitting functional layer 311 that has the smallest length, or, the side of the light-emitting functional layer 311 that has a smallest sum of equivalent components in a direction parallel to the edge or axis of the light-sensing unit 21, wherein, equivalent components of the light-emitting functional layer 311 in a direction parallel to the edge or axis of the light-sensing unit 21 may be determined according to the projection of each edge of the light-emitting functional layer 311 in a direction parallel to the edge or axis of the light-sensing unit 21.

Figure 2:
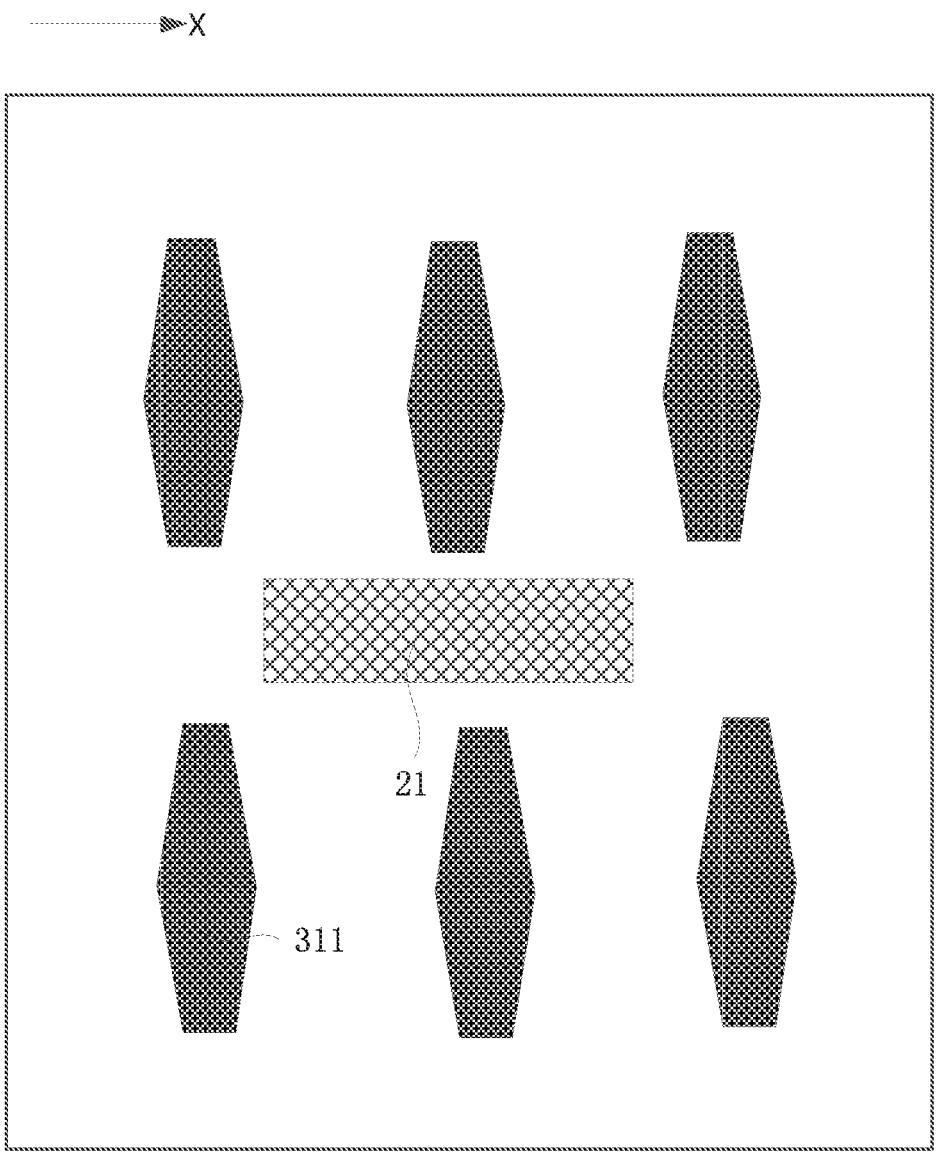
FIG. 2 is a schematic plan view of another display panel according to an embodiment of the disclosure.
Figure 3:
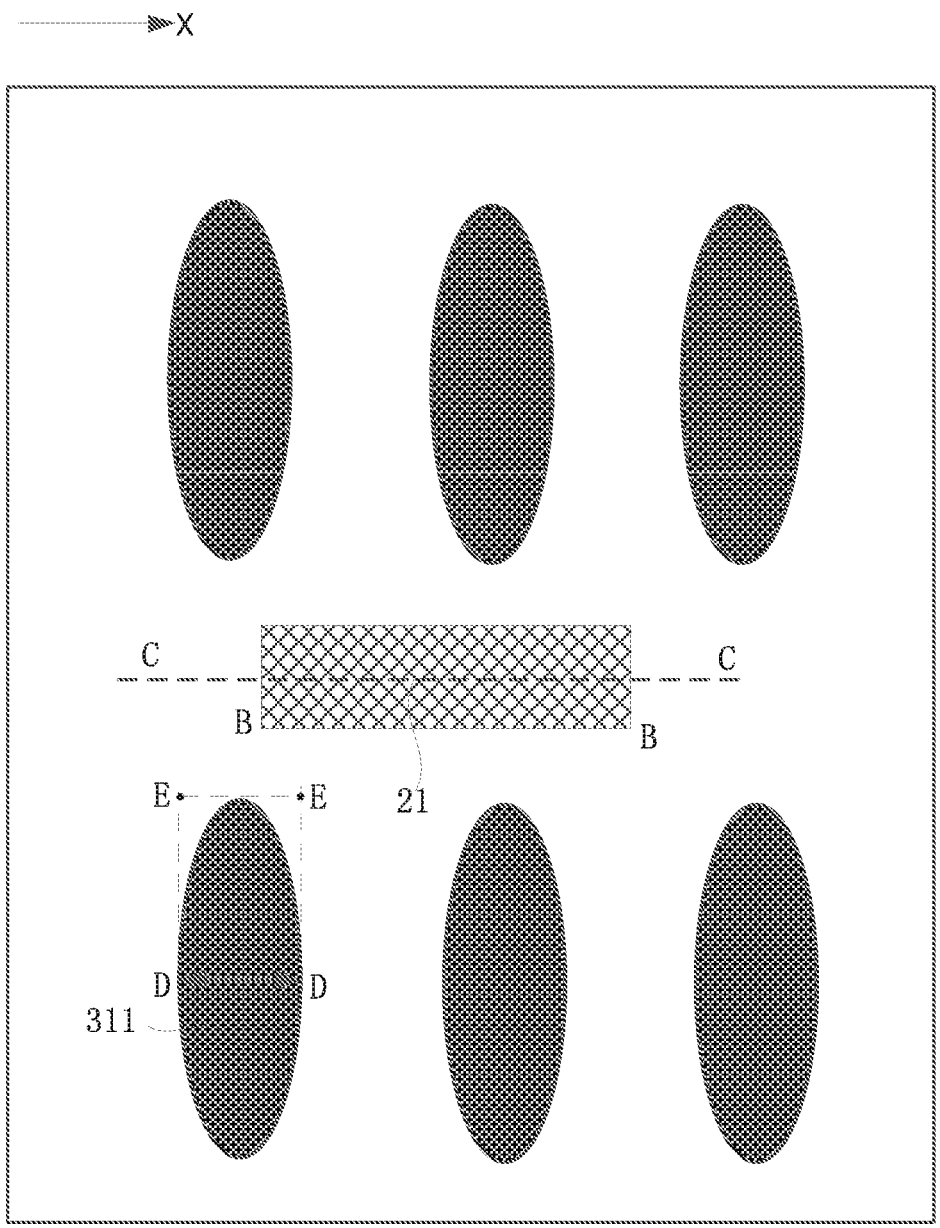
FIG. 3 is a schematic plan view of another display panel according to an embodiment of the disclosure.

FIG. 2 is a schematic plan view of another display panel according to an embodiment of the disclosure, and FIG. 3 is a schematic plan view of another display panel according to an embodiment of the disclosure. Exemplarily, referring to FIG. 1A and FIG. 2, for a light-emitting functional layer 311 with a regular shape, such as a rectangle, a diamond and a polygon, etc., the short edge of the light-emitting functional layer 311 refers to an edge of the light-emitting functional layer 311 with a small length; for a light-emitting functional layer 311 with an irregular shape, such as a polygon or an ellipse, of an arched edge, the short edge of the light-emitting functional layer 311 may be determined according to the sum of equivalent components of the light-emitting functional layer 311 in a direction parallel to the edge or axis of the light-sensing unit 21, and it is regarded as the side which has the smallest sum of components. Referring to FIG. 3, when the minor axis DD of an ellipse light-emitting functional layer 311 is parallel to an edge BB or an axis CC of the light-sensing unit 21, the sum EE of equivalent components of the edges on the two sides of the minor axis DD of the ellipse light-emitting functional layer 311 in a direction parallel to the edge BB or axis CC of the light-sensing unit 21 will be the smallest, so that the edges on the two side of the minor axis of the ellipse light-emitting functional layer will both be the short edge of the light-emitting functional layer 311.

Referring to FIG. 1B, because the light-sensing unit 21 and the display unit 30 are both located on the array substrate 10, light emitted from the side edge of the display unit 30 will irradiate on the light-sensing unit 21, which may cause an increase of the base signal of the light-sensing unit 21 and hence affect the detection of the light-sensing unit 21 on the light signal reflected by a fingerprint. In this embodiment, a vertical projection of the light-sensing unit 21 on a plane including a light-emitting functional layer 311 of the display unit 30 is located between short edges of the light-emitting functional layers 311 of adjacent display units 30, and because little lateral light is emitted from the short edge of the light-emitting functional layer 311, the light irradiated by the display unit 30 on the light-sensing unit 21 can be reduced, so that the affection of the light emitted by the display unit on the light-sensing unit 21 can be reduced, thereby improving the precision of fingerprint identification.

Additionally, for an out-cell fingerprint identification unit 20, it needs to manufacture a light-sensing unit 21 and other components separately, followed by combining them via a lamination process, so that this will cause an increase in the overall thickness of the display panel and go against the development trend of lighter and thinner of display products; in addition, in order to guarantee that the light-sensing unit 21 can receive enough fingerprint reflection light, the display panel needs to have a large light transmission area, and it needs to ensure that the light-sensing unit 21 and the display panel has a high lamination alignment precision, which needs high requirements for the design and process of mainstream display products with Pixels Per Inch (PPI), and hence it is more difficult to realize. In this embodiment, the thickness of the display panel is reduced by manufacturing the light-sensing unit 21 on the array substrate 10 of the display panel; additionally, the light-sensing unit 21 is located on one side of the display drive circuit 13 that is facing away from the base substrate 110, so that the fingerprint reflection light would not be blocked by the display drive circuit 13, and no alignment lamination is necessary, and hence the process difficulty will be lowered, and the precision of fingerprint detection will be improved.

Additionally, the fingerprint identification unit 20 further includes a fingerprint identification circuit 22. FIG. 1B exemplarily shows the structures and locations of the fingerprint identification circuit 22 and the display drive circuit 13, but the disclosure is not limited hereto.

In one embodiment, referring to FIG. 1A, a plurality of display units 30 are arranged successively along a first direction X, and the short edges of the light-emitting functional layers 311 of adjacent two rows of the display units 30 arranged along the first direction X are provided opposite to each other;

A vertical projection of the light-sensing unit 21 on a plane including the light-emitting functional layer 311 of the display unit 30 is located between the light-emitting functional layers 311 of adjacent two rows of display units 30 arranged along the first direction X.

By such an arrangement, the affection of the light emitted from the side edge of the display unit 30 on the light-sensing unit 21 can be reduced to the maximum extent, so that the precision of fingerprint identification can be further improved.

In one embodiment, referring to FIG. 1A, the shape of the light-emitting functional layer 311 of the display unit 30 is a rectangle.

Specifically, referring to FIG. 2 and FIG. 3, the shape of the light-emitting functional layer 311 may also be an ellipse and a polygon, etc., which is not specifically limited.

Referring to FIG. 1B, the display unit includes a light-emitting functional layer 311, a first electrode 314 and a reflection electrode 313; the light-emitting functional layer 311 is provided between the first electrode 314 and the reflection electrode 313; the first electrode 314 is provided on one side of the light-emitting functional layer 311 that is facing away from the array substrate 10;

The light-sensing unit 21 is provided between the film layer including the first electrode 314 and the array substrate 10.

Specifically, the first electrode 314 may be an anode, the reflection electrode 313 may be a cathode, and the light-emitting functional layer 311 may be a red light-emitting layer, a green light-emitting layer or a blue light-emitting layer. A pixel-defining layer 312 of the display panel exists between the film layer including the first electrode 314 and the array substrate 10. On one hand, the pixel-defining layer 312 is configured to cover the structures such as the display drive circuit 13 and the like to planarize the array substrate 10; on the other hand, it is configured to define a light emitting region and a non-light emitting region of the display panel, that is, to define each display unit 30. The opening area of the pixel-defining layer 312 is a light emitting region of the display panel, the non-opening area is a non-light emitting region of the display panel. By providing the light-sensing unit 21 between the film layer including the first electrode 314 and the array substrate 10, that is, by setting that the light-sensing unit 21 occupies a part of the non-opening area of the pixel-defining layer 312, the light emitted by the display unit 30 will not be blocked, that is, the visual angle of the display panel will not be affected, and because the pixel-defining layer 313 is thick, after the light-sensing unit 21 occupies a part of the pixel-defining layer 312, the thickness of the display panel will not be increased, thereby complying with the development trend of lighter and thinner of the display products.

Figure 4:
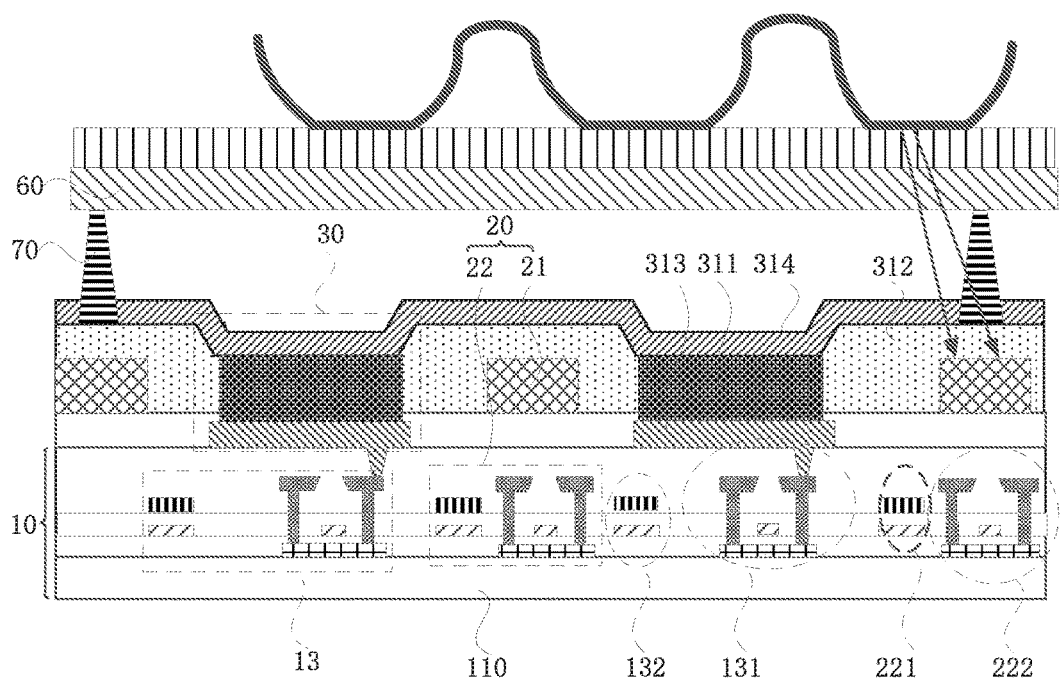
FIG. 4 is a schematic sectional view of another display panel according to an embodiment of the disclosure.
Figure 5:
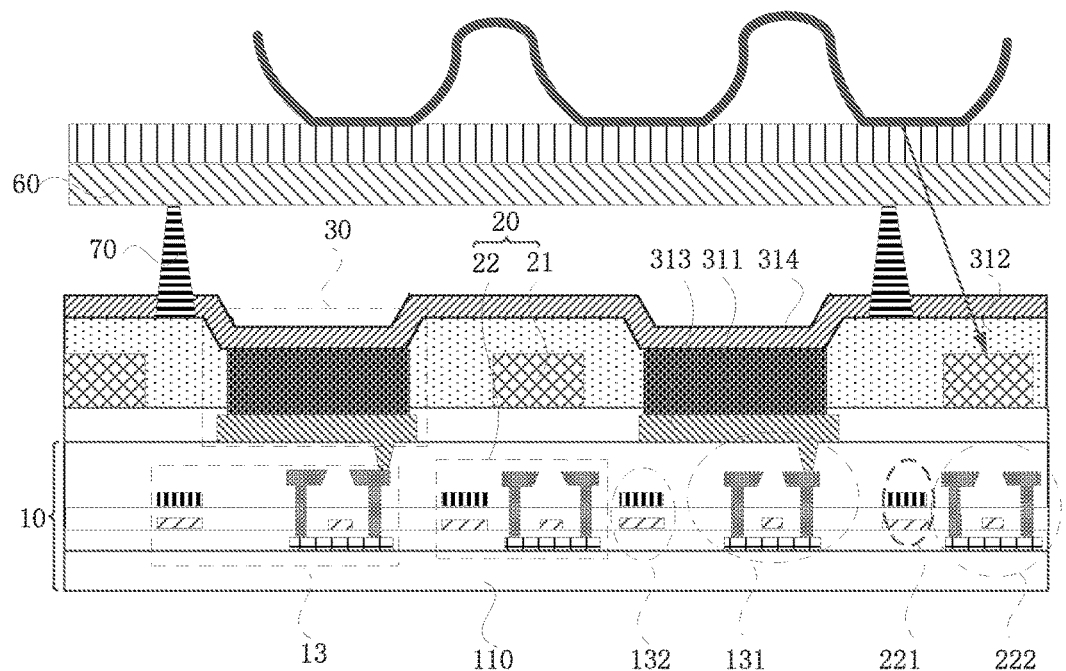
FIG. 5 is a schematic sectional view of another display panel according to an embodiment of the disclosure.

FIG. 4 is a schematic sectional view of another display panel according to an embodiment of the disclosure. FIG. 5 is a schematic sectional view of another display panel according to an embodiment of the disclosure. In one embodiment, referring to FIG. 4 and FIG. 5, the display panel further includes:

an encapsulation layer 60, which is provided on one side of the display unit 30 that is facing away from the array substrate 10;

a support column 70, which is provided between the encapsulation layer 60 and the array substrate 10; the vertical projection of the support column 70 on the array substrate 10 does not overlap with the vertical projection of the light-sensing unit 21 on the array substrate 10 (referring to FIG. 5), or, the vertical projection of the light-sensing unit 21 on the array substrate 10 covers the vertical projection of the support column 70 on the array substrate 10 (referring to FIG. 4).

Specifically, the encapsulation layer 60 is configured to encapsulate the display unit 30 and other structures of the display panel to prevent them from being corroded by aqueous vapor and oxygen. The support column 70 is provided on the surface of the pixel-defining layer 312 and configured to support mask plates for manufacturing the light-emitting functional layer 311 and the first electrode 314 and support the encapsulation layer 60 after the light-emitting functional layer 311 and the first electrode 314 are manufactured. Because the light-sensing unit 21 has a certain thickness, after the light-sensing unit 21 is provided on the array substrate 10 and the pixel-defining layer 312 covers the light-sensing unit 21, the corresponding region above the light-sensing unit 21 will still be higher than other regions even though the pixel-defining layer 312 can have a certain planarization action. According to this embodiment, the vertical projection of the support column 70 on the array substrate 10 does not overlap with the vertical projection of the light-sensing unit 21 on the array substrate 10 or the vertical projection of the light-sensing unit 21 on the array substrate 10 covers the vertical projection of the support column 70 on the array substrate 10, it may guarantee that the support column 70 of the display panel is provided on a plane of the same height, thereby ensuring the uniformity of the height of the support column 70 manufactured, so that the manufacture precision and the like of the subsequent light-emitting functional layer 311 and first electrode 314 may be guaranteed.

Figure 6:
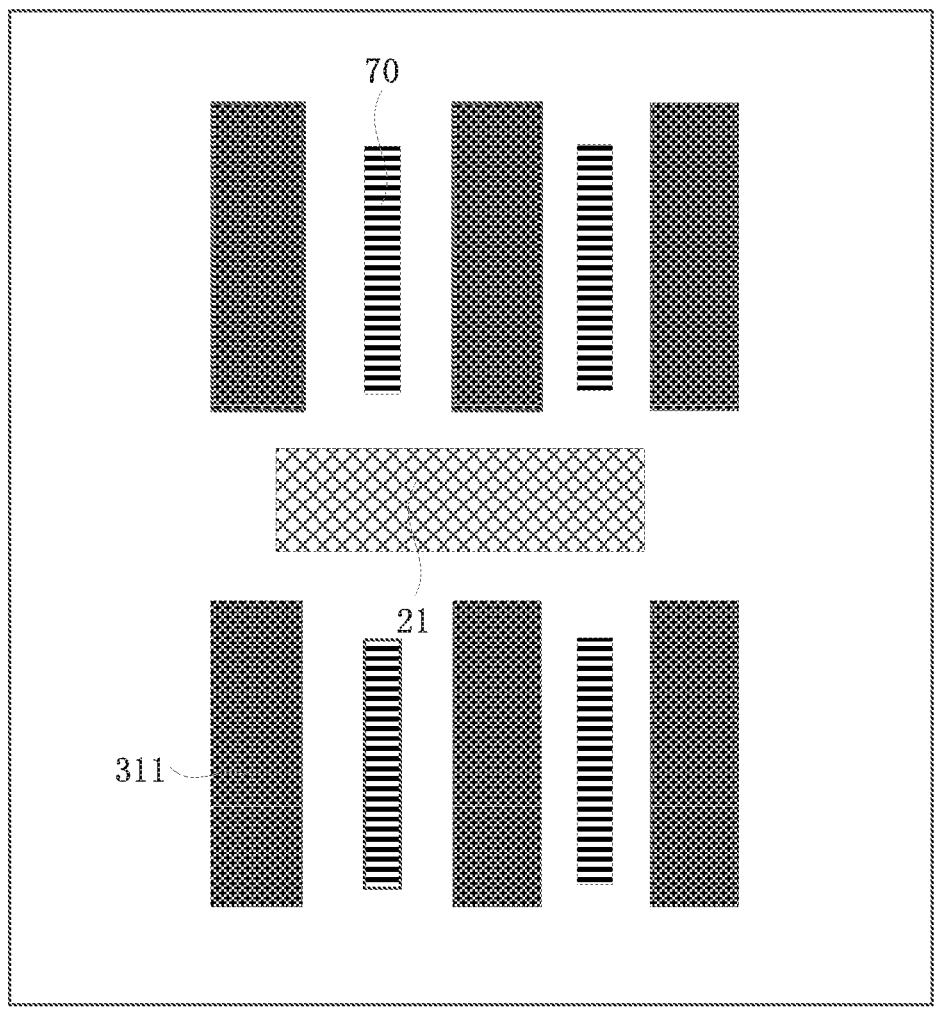
FIG. 6 is a schematic plan view of another display panel according to an embodiment of the disclosure.

Referring to FIG. 4 and FIG. 5, the encapsulation layer 60 may be a transparent rigid cover plate, and air or nitrogen gas is filled in the region between the transparent rigid cover plate and the array substrate 10. If the support column 70 is provided in a region right above the light-sensing unit 21, that is, the vertical projection of the light-sensing unit 21 on the array substrate 10 covers the vertical projection of the support column 70 on the array substrate 10, during transmission, one part of the fingerprint reflection light will pass through a nitrogen gas layer or an air layer and reach the light-sensing unit 21, and the other part of the fingerprint reflection light will pass through the support column 70 and reach the light-sensing unit 21; because the support column 70 employs an organic material and the refractive index of the organic material is largely different from that of nitrogen gas or air, the propagation paths of the fingerprint reflection light will be different, and hence the detection of the fingerprint reflection light by the light-sensing unit 21 may be affected. However, when the vertical projection of the support column 70 on the array substrate 10 does not overlap with the vertical projection of the light-sensing unit 21 on the array substrate 10, a majority of the fingerprint reflection light will pass through the air layer or the nitrogen gas layer and directly reach the light-sensing unit 21. Therefore, the vertical projection of the support column 70 on the array substrate 10 may not be overlap with the vertical projection of the light-sensing unit 21 on the array substrate 10. FIG. 6 is a schematic plan view of another display panel according to an embodiment of the disclosure, and, the support column 70 may be provided between the long edges of the light-emitting functional layer 311 of the light-sensing unit 21.

In one embodiment, referring to FIG. 5, the display drive circuit 13 includes at least two first thin-film transistors 131 and at least one capacitor 132.

Specifically, the display drive circuit 13 is configured to provide a scanning signal and a data signal to the display unit 30 for driving the display unit 30 to display a picture. FIG. 5 only exemplarily shows one capacitor 132 and a first thin-film transistor 131 connected with the reflection electrode 313, but the disclosure is not limited hereto. Additionally, referring to FIG. 5, one plate electrode of the capacitor 132 may be provided on the same layer as the gate electrode of the first thin-film transistor 131 and manufactured by the same material in the same process to reduce the process steps and lower the process cost.

Figure 7A:
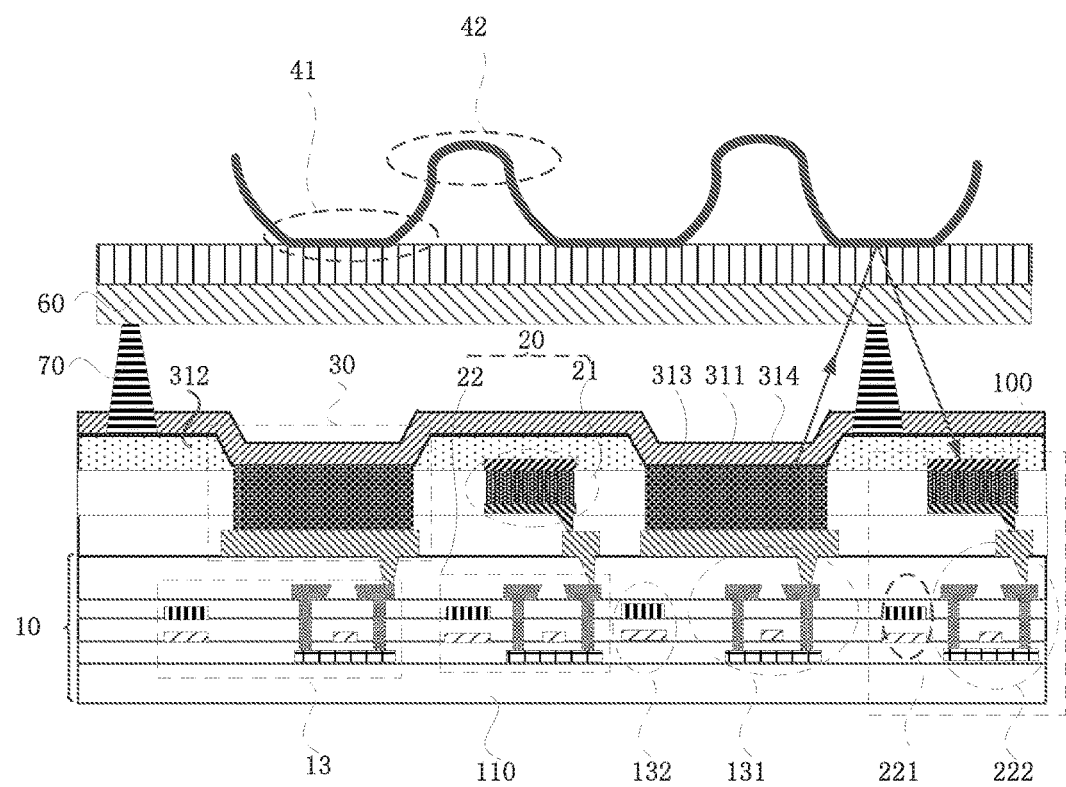
FIG. 7A is a schematic sectional view of another display panel according to an embodiment of the disclosure.
Figure 7B:
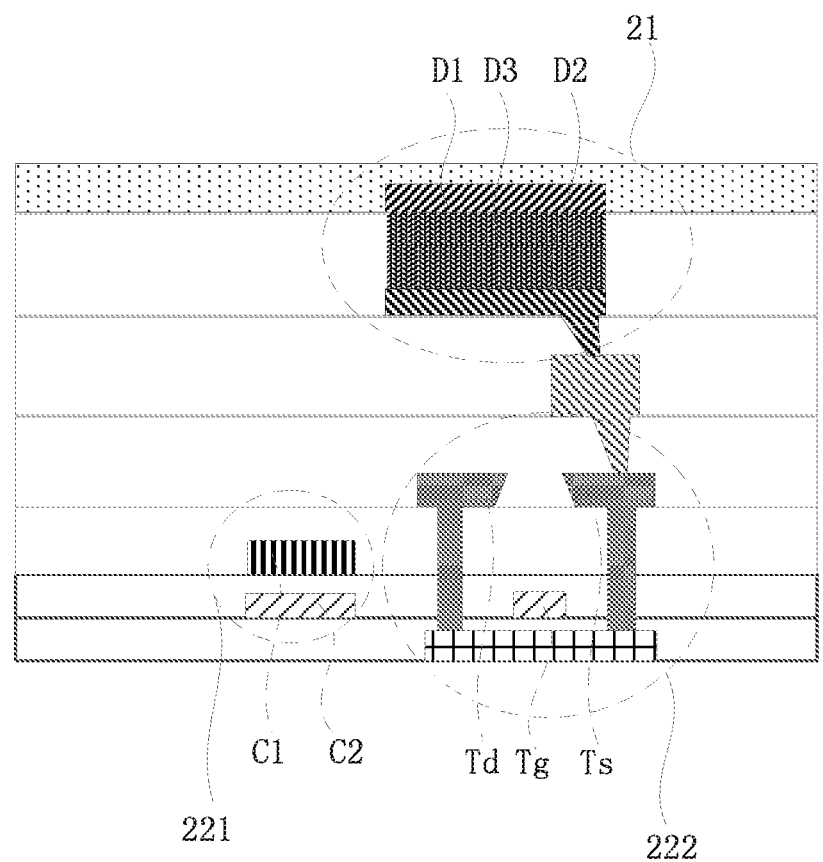
FIG. 7B is a close-up view of a region 100 in FIG. 7A.
Figure 8:
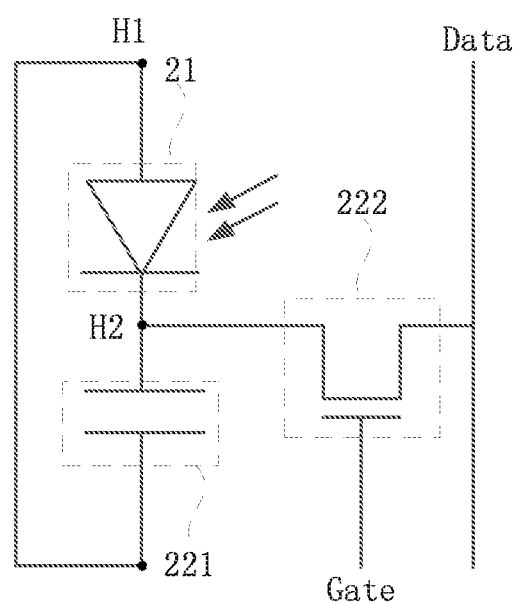
FIG. 8 is a schematic circuit diagram of a fingerprint identification unit according to an embodiment of the disclosure.

FIG. 7A is a schematic sectional view of another display panel according to an embodiment of the disclosure, FIG. 7B is a close-up view of a region 100 in FIG. 7A, and FIG. 8 is a schematic circuit diagram of a fingerprint identification unit according to an embodiment of the disclosure. In one embodiment, referring to FIG. 7A, FIG. 7B and FIG. 8, the fingerprint identification unit 20 further includes a fingerprint identification circuit 22, which includes a storage capacitor 221 and a second thin-film transistor 222;

A top electrode D1 of the light-sensing unit 21 is electrically connected with a first electrode C1 of the storage capacitor 221, and a bottom electrode D2 of the light-sensing unit 21 is electrically connected with a second electrode C2 of the storage capacitor 221 and a source electrode Ts of the second thin-film transistor 222; a gate electrode Tg of the second thin-film transistor 222 is electrically connected with a switch control line Gate, and a drain electrode Td is electrically connected with a signal detection line Data.

In one embodiment, referring to FIG. 7A, the second thin-film transistor 222 is provided on the same layer as each film layer of at least two first thin-film transistors 131 of the display drive circuit 13. By such an arrangement, the overall thickness of the display panel may be reduced, thereby complying with the development trend of lighter and thinner of the display products. Additionally, the second thin-film transistor 222 may be formed of the same material and in the same process as each film layer of at least two first thin-film transistors 131 of the display drive circuit 13, and hence the process steps may be reduced, and the process cost may be lowered.

In one embodiment, referring to FIG. 7A, the storage capacitor 221 is provided on the same layer as each film layer of at least one capacitor 132 of the display drive circuit 13. By such an arrangement, the overall thickness of the display panel may be reduced, thereby complying with the development trend of lighter and thinner of the display products.

Additionally, the storage capacitor 221 may be formed of the same material and in the same process as each film layer of at least one capacitor 132 of the display drive circuit 13, and hence the process steps may be reduced, and the process cost may be lowered.

In one embodiment, referring to FIG. 7B, the light-sensing unit 21 includes a PIN junction D3 located between the top electrode D1 and the bottom electrode D2, wherein the bottom electrode D2 is a light-tight metallic layer, and the bottom electrode D2 is located on one side of the PIN junction D3 that is adjacent to the array substrate 10.

The PIN junction D3 is consisted of a P-type semiconductor, an N-type semiconductor and an intrinsic semiconductor (I-type layer) between the P-type semiconductor and the N-type semiconductor. The PIN junction D3 is a part of the light-sensing unit 21 for sensing light. The bottom electrode D2 is formed of a light-tight metal, and the boundary of the PIN junction D3 does not exceed the boundary of the bottom electrode D2. The PIN junction D3 has a photosensitive feature and a unilateral conductivity. When no light is irradiated, the PIN junction D3 has a very small saturated reverse leakage current, i.e., dark current, and at this time, the photosensitive diode D is cut off. When light is irradiated, the saturated reverse leakage current of the PIN junction D3 increases greatly, and a photoelectric current is formed, which changes with the intensity of the incident light.

Figure 9A:
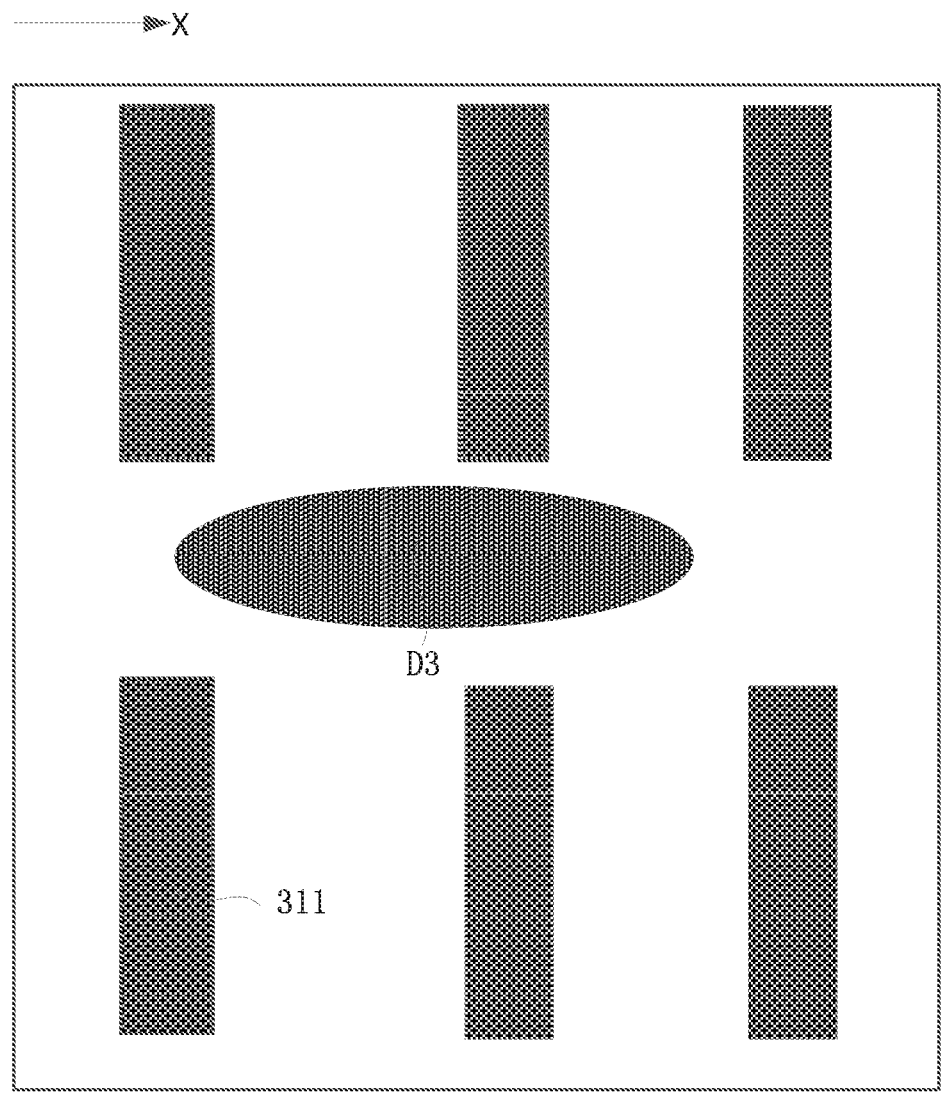
FIG. 9A is a schematic plan view of another display panel according to an embodiment of the disclosure.
Figure 9B:
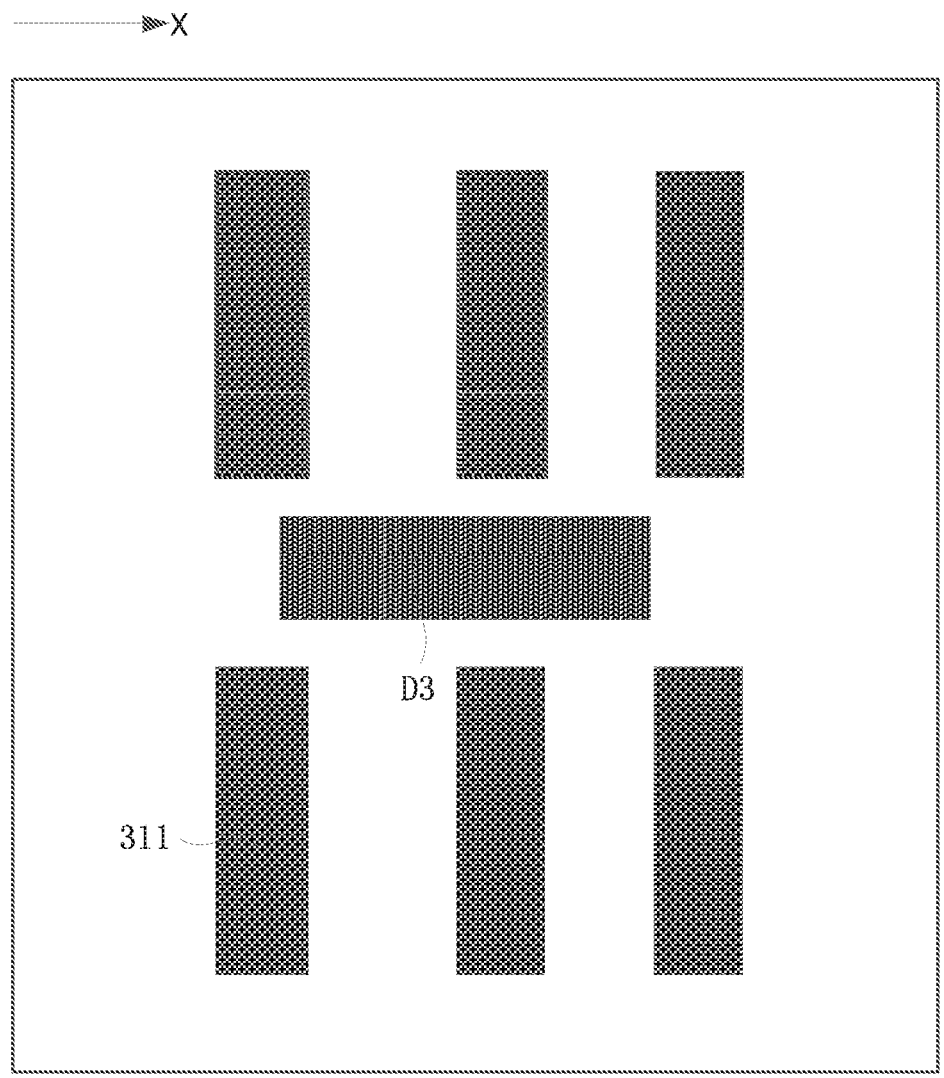
FIG. 9B is a schematic plan view of another display panel according to an embodiment of the disclosure.
Figure 9C:
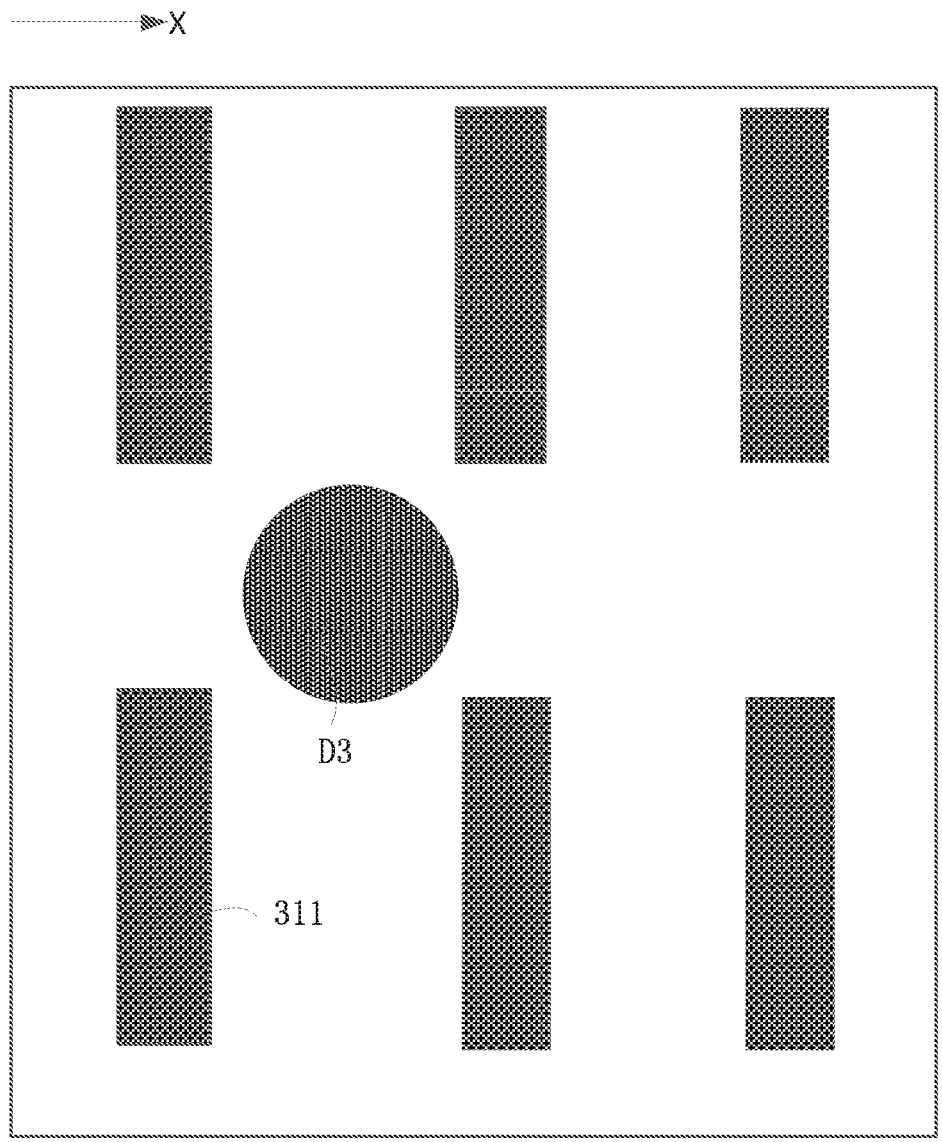
FIG. 9C is a schematic plan view of another display panel according to an embodiment of the disclosure.

FIG. 9A is a schematic plan view of another display panel according to an embodiment of the disclosure, FIG. 9B is a schematic plan view of another display panel according to an embodiment of the disclosure, and FIG. 9C is a schematic plan view of another display panel according to an embodiment of the disclosure. In one embodiment, referring to FIG. 9A-FIG. 9C, the shape of the vertical projection of the PIN junction D3 on the array substrate 10 is a rectangle, a circle or an ellipse.

Specifically, the intensity of the light signal received by the light-sensing unit 21 is directly related to the area of the PIN junction D3 for receiving light, and the larger the area is, the larger the signal intensity will be. In order to make the PIN junction D3 has a large area for receiving light, in the case that the light emitting area of the display panel is given, the non-light emitting area of the display panel, i.e., the region between the light-emitting functional layers 311 of the display units 30, may be suffused with the light-sensing units 21 as much as possible. However, on the other hand, the intensity of the light signal detected by the light-sensing unit 21 is further influenced by the leakage current of the light-sensing unit 21, while the leakage current is related to the shape of the PIN junction D3, and the longer the overall length of the boundary of the PIN junction D3 is, the larger the leakage current will be, which may cause a decrease of the amount of the detected signals. Therefore, in the case that the area of the PIN junction D3 for receiving light is given, the shape of the vertical projection of the PIN junction D3 on the array substrate 10 is preferably designed as a rectangle, a circle or an ellipse to reduce the length of the boundary of the PIN junction D3, reduce the leakage current and improve the signal detection precision of the light-sensing unit 21, thereby improving the precision of fingerprint identification.

Exemplarily, the principle of fingerprint identification will be illustrated in detail in conjunction with FIG. 7A, FIG. 7B and FIG. 8. In the fingerprint identification stage, a low-voltage signal (for example, a constant voltage signal of −5V) is input to node H1, and a high-voltage signal (for example, a constant voltage signal of 1.5V) is input to signal line Data. The whole fingerprint identification stage includes a preparation stage, a fingerprint signal acquisition stage and a fingerprint signal detection stage. In the preparation stage, a drive chip electrically connected with the fingerprint identification unit 20 (not shown in FIG. 7A, FIG. 7B and FIG. 8) controls the second thin-film transistor 222 of the fingerprint identification unit 20 to be turned on via a switch control line Gate, and the storage capacitor 221 is charged until it is fully charged. In the fingerprint signal acquisition stage, it controls the second thin-film transistor 222 of the fingerprint identification unit 20 to be turned off via the switch control line Gate. When a user press a finger on the display panel, light emitted by a fingerprint identification light source is irradiated on the finger, and reflected light is formed by reflecting on the surface of the fingerprint. The reflected light formed by reflecting on the fingerprint irradiates into the fingerprint identification unit 20 and received by the light-sensing unit 21 of the fingerprint identification unit 20, and a photoelectric current is formed, the photoelectric current flows in a direction from node H2 to node H1, so that the potential on H2 is changed. In the fingerprint signal detection stage, the potential variation of the node H2 may be directly detected, thereby determining the photoelectric current.

In one embodiment, in the fingerprint signal detection stage, the second thin-film transistor 222 of the fingerprint identification unit 20 may also be controlled to be turned on via the switch control line Gate, and at this time, a potential difference exists between the two electrodes of the storage capacitor 221, and the storage capacitor 221 is in a charging state, so that the photoelectric current may be determined by detecting the quantity of electric charges charged into the storage capacitor 221.

Still referring to FIG. 7A, because the ridge 41 of the fingerprint pressed on the display panel contacts the surface of the display panel, while the valley 42 does not contact the surface of the display panel, the reflectivity of the light irradiating on the valley 42 of the fingerprint will be different will be different from that of the light irradiating on the ridge 41, thereby causing the different intensities of the reflected light formed at the ridge 41 and the reflected light formed at the valley 42 that are received by the fingerprint identification unit 20, so that the magnitudes of the photoelectric current converted from the reflected light formed at the ridge 41 and the reflected light formed at the valley 42 will be different. Fingerprint identification may be performed according to the magnitude of the photoelectric current.

It is noted that, in FIG. 7A, the display unit 30 is taken as the fingerprint identification light source, and no fingerprint identification light source is provided additionally; however, the disclosure is not limited hereto, and an additional fingerprint identification light source may also be provided in other embodiments.

Figure 10:
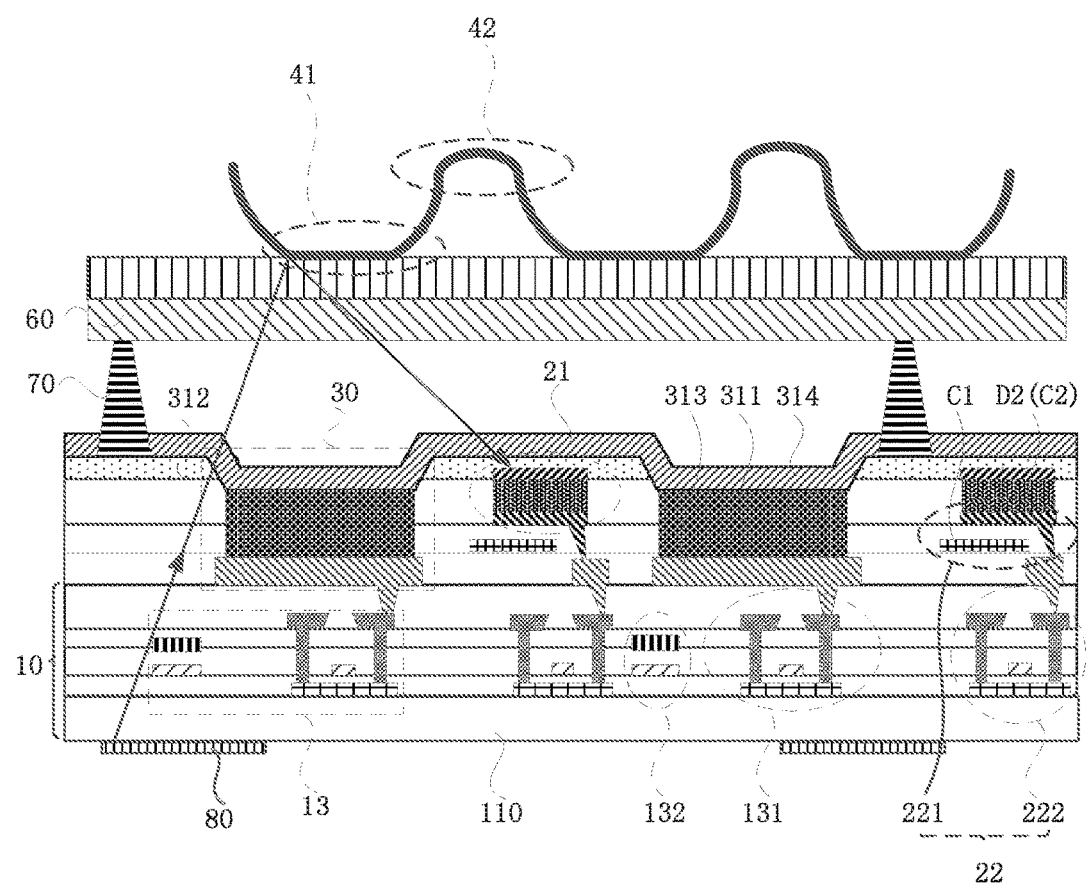
FIG. 10 is a schematic sectional view of another display panel according to an embodiment of the disclosure.

FIG. 10 is a schematic sectional view of another display panel according to an embodiment of the disclosure. In one embodiment, referring to FIG. 10, the display panel further includes a fingerprint identification light source 80, which is located on one side of the base substrate 110 that is facing away from the display drive circuit 13. Specifically, the light emitted by the fingerprint identification light source 80 irradiates on a finger, and the light reflected by the finger enters into the light-sensing unit 21, so that fingerprint identification can be performed. The fingerprint identification light source 80 may be a collimated light source. In comparison with an area light source, the use of a collimated light source may alleviate the crosstalk of the fingerprint scattered light between different fingerprint identification units 20 and improve the precision of fingerprint identification. However, because a collimated light source is often thicker than an area light source, the use of a collimated light source will increase the thickness of the display panel.

In one embodiment, referring to FIG. 10, the storage capacitor 221 is provided on the array substrate 10 and located on one side of the display drive circuit 13 that is facing away from the base substrate 110; the vertical projection of the storage capacitor 221 on the plane including the light-emitting functional layer 311 of the display unit 30 is located between the light-emitting functional layers 311 of adjacent display units 30.

Specifically, when the display drive circuit 13 is complex circuit, that is, when the display drive circuit 13 includes a large number of first thin-film transistors 131 or capacitors 132, the region on the base substrate 110 for arranging other devices will be small; in order to avoid the mutual interference between the devices, the storage capacitor 221 may be provided on the array substrate 10 and located on one side of the display drive circuit 13 that is facing away from the base substrate 110.

In one embodiment, referring to FIG. 10, the bottom electrode D2 of the light-sensing unit 21 is multiplexed as the second electrode C2 of the storage capacitor 221, and the first electrode C1 of the storage capacitor 221 is provided on one side of the light-sensing unit 21 that is adjacent to the array substrate 10.

By such an arrangement, the second electrode C2 of the storage capacitor 221 may be formed in the same process as the bottom electrode D2 of the light-sensing unit 21, and hence the process steps may be reduced, and the cost may be saved. Additionally, by multiplexing the bottom electrode D2 of the light-sensing unit 21 as the second electrode C2 of the storage capacitor 221, a film layer may be reduced in terms of the structure, so that space available for the first electrode C1 of the storage capacitor 221 may be larger, and the location thereof may be provided more flexibly.

Figure 11:
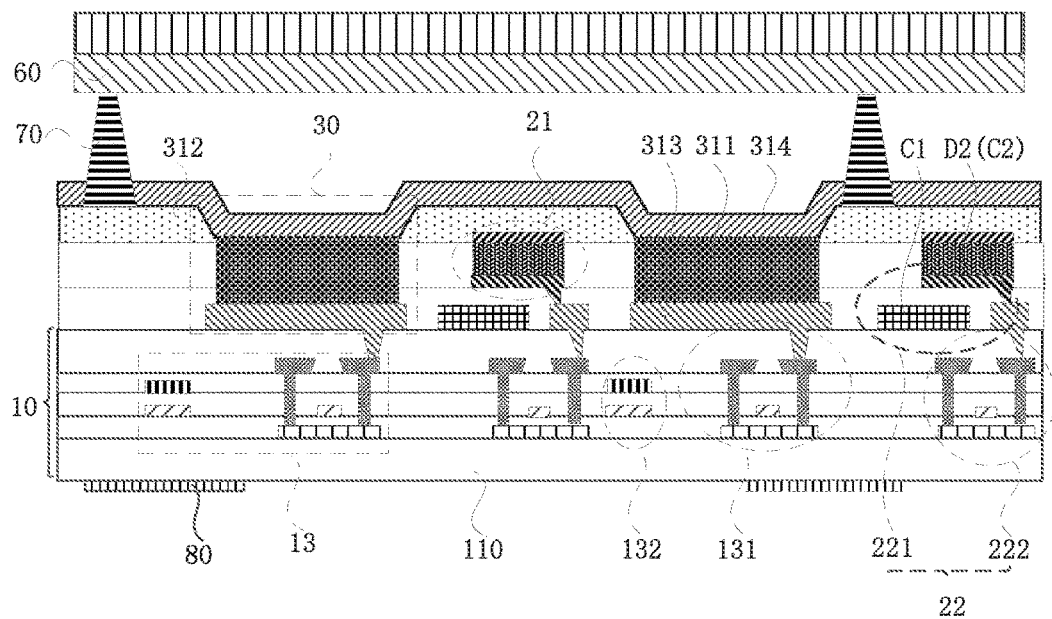
FIG. 11 is a schematic sectional view of another display panel according to an embodiment of the disclosure.

FIG. 11 is a schematic sectional view of another display panel according to an embodiment of the disclosure. In one embodiment, referring to FIG. 11, the first electrode C1 of the storage capacitor 211 is provided on the same layer as the reflection electrode 313 of the display unit 30.

By such an arrangement, the first electrode C1 of the storage capacitor 221 may be formed of the same material and in the same process as the reflection electrode 313 of the display unit 30, and hence the process steps may be reduced, and the process cost may be lowered.

Figure 12A:
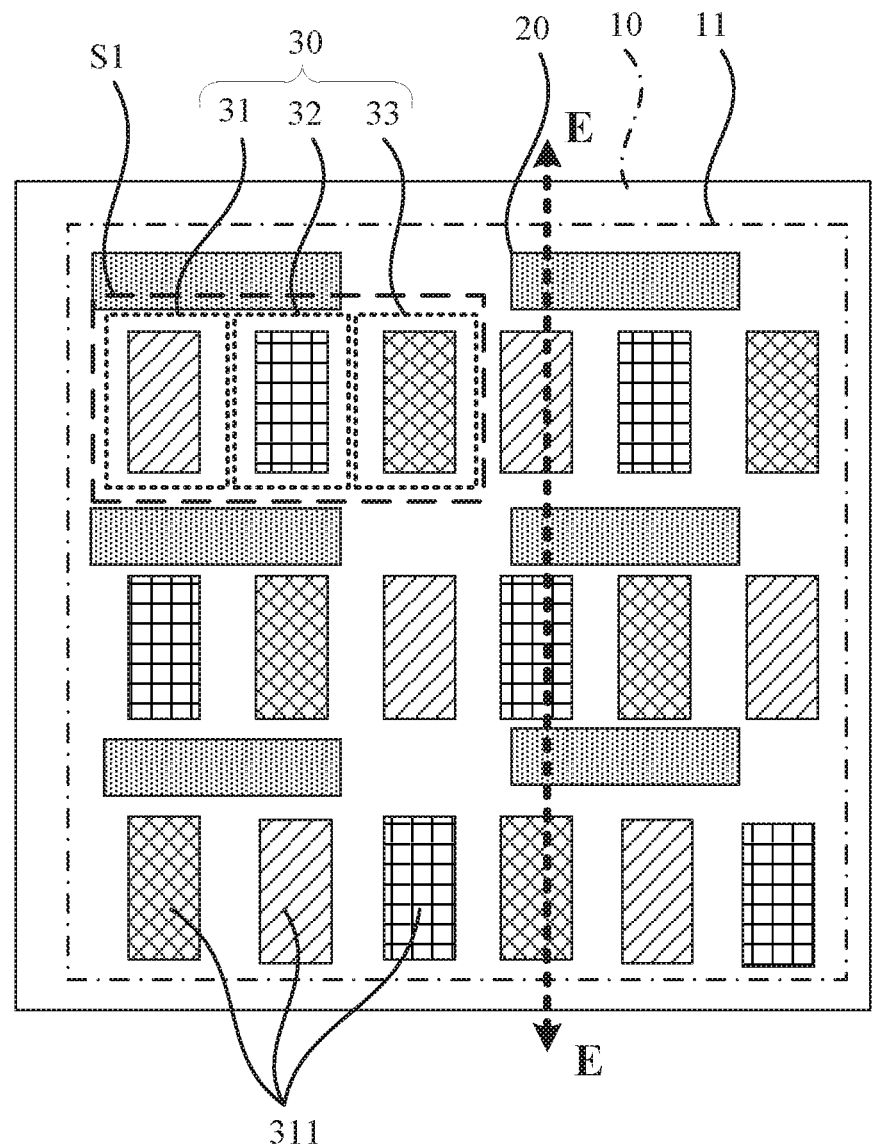
FIG. 12A is a top view showing the structure of a touch display panel according to an embodiment of the disclosure.
Figure 12B:
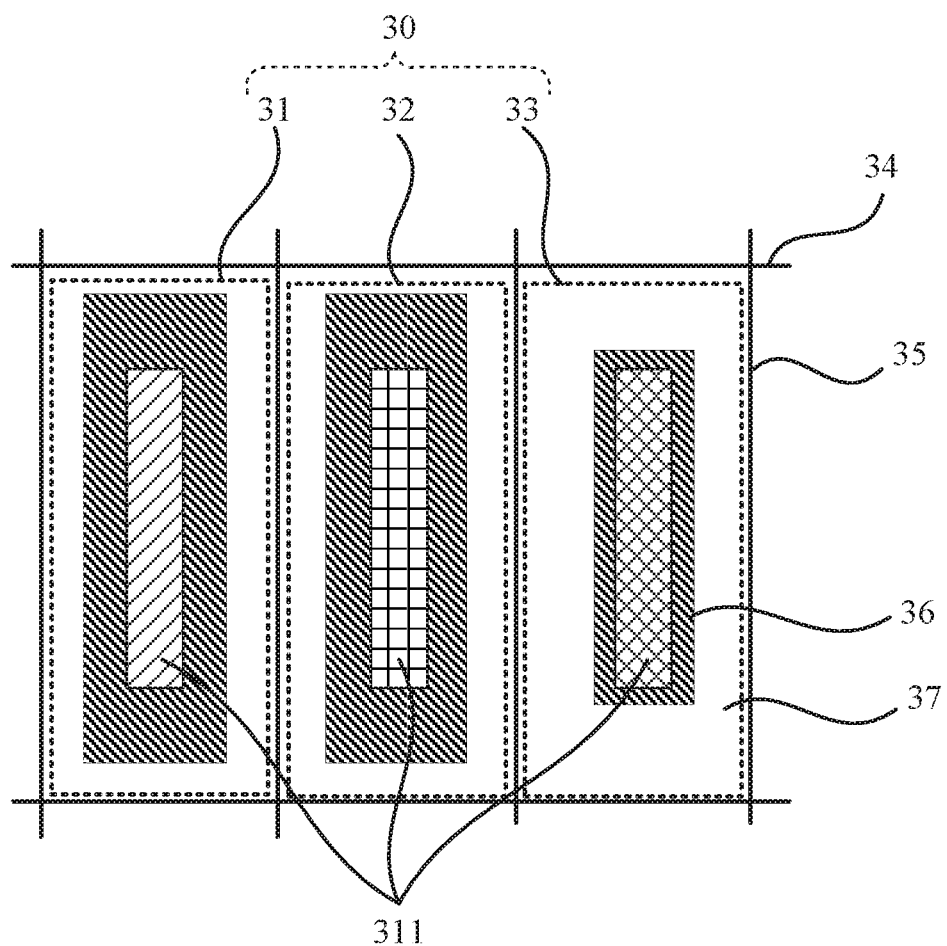
FIG. 12B is a close-up view of an S1 region in FIG. 12A.
Figure 12C:
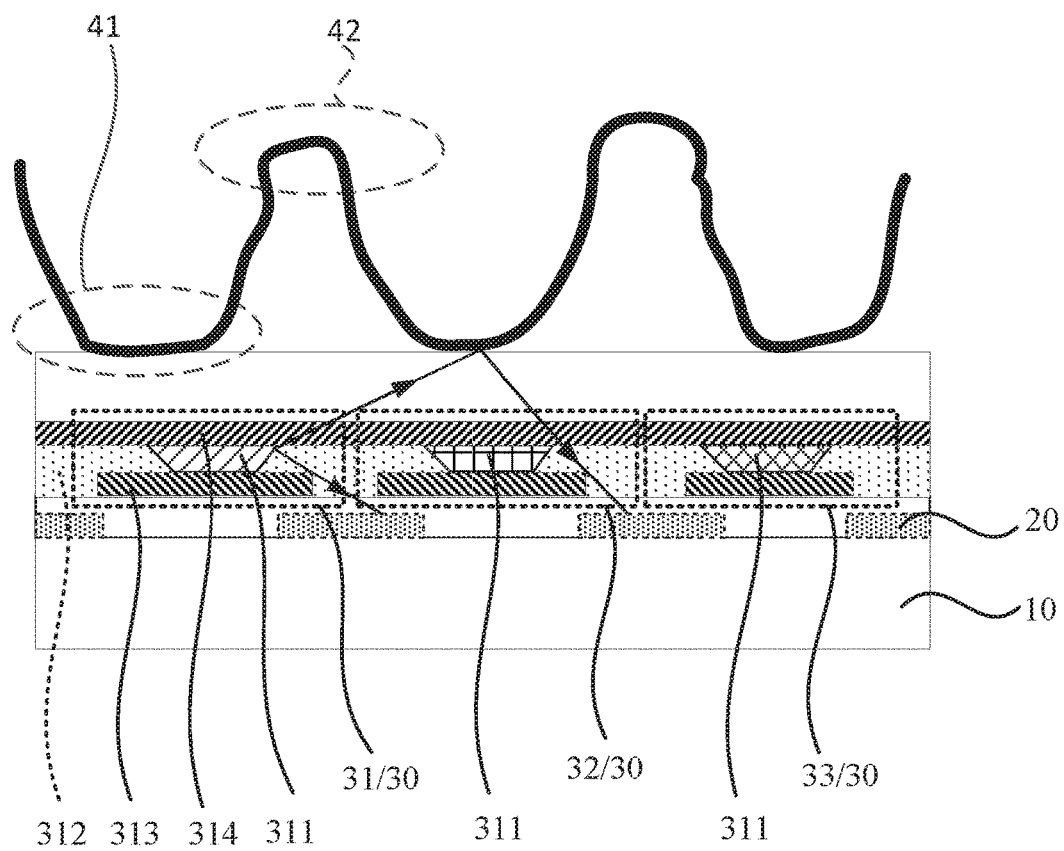
FIG. 12C is a schematic sectional view taking along section line E-E of the display panel in FIG. 12A.

FIG. 12A is a top view showing the structure of a touch display panel according to an embodiment of the disclosure, FIG. 12B is a close-up view of an S1 region in FIG. 12A, and FIG. 12C is a schematic sectional view taking along section line E-E of the display panel in FIG. 12A. Referring to FIG. 12A, FIG. 12B and FIG. 12C, the touch display panel according to an embodiment of the disclosure includes an array substrate 10, a plurality of display units 30 and at least one fingerprint identification unit 20. The plurality of display units 30 is located on the array substrate 10, the fingerprint identification unit 20 is located in display region 11 on one side of the display unit 30 that is adjacent to the array substrate 10, the fingerprint identification unit 20 is configured to perform fingerprint identification according to the light reflected to the fingerprint identification unit 20 by a touch body (for example, a finger), the display unit 30 includes a red display unit 31, a green display unit 32 and a blue display unit 33. In the fingerprint identification stage, the red display unit 31 and/or the green display unit 32 emit/emits light and functions as a light source of the fingerprint identification unit 20. The light transmission area of the red display unit 31 and/or the green display unit 32 functioning as the light source of the fingerprint identification unit 20 towards the display side departing from the touch display panel is less than the light transmission area of the blue display unit 33 towards the display side departing from the touch display panel. It is noted that, the number of display units and the arrangement of the red display units, the green display units and the blue display units in the display unit are not defined in the embodiments of the disclosure.

Exemplarily, referring to FIG. 12B and FIG. 12C, each of the display units 30 successively includes a second electrode 313, a light-emitting functional layer 311 and a first electrode 314 along the direction in which the display unit 30 departs from the array substrate 10, wherein the display unit 30 includes a red display unit 31, a green display unit 32 and a blue display unit 33, the display unit 30 includes a light-emitting functional layer 311, and a light transmission region 37 and a light-tight region 36 is present in the direction in which the light-emitting functional layer 311 departs from the display side of the touch display panel. For a top-emission touch display panel, the display side of the touch display panel is the direction in which the display unit 30 departs from the array substrate 10. Wherein, the light-emitting functional layer 311 may include a first auxiliary functional layer, a luminescent material layer and a second auxiliary functional layer. The first auxiliary functional layer is a hole-type auxiliary functional layer, and may have a multilayer structure, for example, it may include one or more of a hole injection layer, a hole transport layer and an electron blocking layer. The second auxiliary functional layer is an electron-type auxiliary functional layer, and may also have a multilayer structure and include one or more of an electron transport layer, an electron injection layer and a hole blocking layer. Under the action of an external electric field, electrons and holes are injected respectively from the first electrode 314 and the second electrode 313 into the luminescent material layer in the light-emitting functional layer 311 and combined to generate excitons, and the excitons migrate under the action of an external electric field, transfer the energy to the luminescent molecules in the luminescent material layer and excite the electrons from a ground state to an excitation state. In the excitation state, energy is released via radiative transition, and hence light is generated. In this embodiment, the second electrode 313 is provided as an anode, and the first electrode 314 is provided as an anode. In other embodiments, the second electrode 313 may be provided as a cathode, and the first electrode 314 may be provided as an anode, which is not limited in the embodiments of the disclosure.

Referring to FIG. 12C, the light emitted by a light source irradiates on a touch body, the touch body is usually a finger, and a fingerprint is consisted of a series of ridges 41 and valleys 42 on the skin surface of the finger tip. Because the intensities of light reflected by the ridges 41 and the valley 42 that are received by the fingerprint identification unit are different from each other, the magnitudes of the electric current signals converted from the reflected light formed at the ridges 41 and the reflected light formed at the valleys 42 are different, and thereby fingerprint identification may be performed according to the magnitude of the electric current signal. It is noted that, the touch body may also be a palm, etc., and hence the detection and identification function may be realized via the palm print.

The touch display panel according to an embodiment of the disclosure includes a plurality of display units and at least one fingerprint identification unit, wherein the display unit includes a red display unit, a green display unit and a blue display unit. In the light emitting display stage, the red display unit, the green display unit and the blue display unit emit light as preset; in the fingerprint identification stage, because the wavelength of the light emitted by the display unit is short and each film layer (an organic insulating layer, an inorganic insulating layer and a sheet polarizer, etc.) in the display panel has a strong absorption on short-wavelength light, the light emitted by the blue display unit has a low light transmittance. Therefore, the light emitted by the red display unit and/or the green display unit is taken as the light source of the fingerprint identification unit; moreover, according to the embodiment, the light transmission area of the red display unit and/or the green display unit functioning as the light source of the fingerprint identification unit towards the display side departing from the touch display panel is less than the light transmission area of the blue display unit towards the display side departing from the touch display panel. By such an arrangement, since the display unit functioning as the light source has a smaller light transmission area, the stray light directly irradiating on the fingerprint identification unit without being reflected by the touch body (for example, a finger) will be reduced. Because only the light reflected by the touch body carries the fingerprint information and the light directly irradiating on the fingerprint identification unit without being reflected by the touch body (that is, the stray light) does not carry the fingerprint information, the noise during fingerprint detection is reduced by reducing the stray light in the embodiment of the disclosure, thereby improving the precision of fingerprint identification.

In one embodiment, referring to FIG. 12B and FIG. 12C, each of the display units 30 successively includes a second electrode 313, a light-emitting functional layer 311 and a first electrode 314 along the direction in which the display unit 30 departs from the array substrate 10, wherein, the second electrode 313 is a reflection electrode, and for example, the reflection electrode may include a tin indium oxide conducting film, a reflection electrode layer (Ag) and a tin indium oxide conducting film that are provided successively. The tin indium oxide conducting film is a material with a high work function, which is favorable for hole injection. A pixel-defining layer 312 is further provided between the light-emitting functional layer 311 of the red display unit 31, the light-emitting functional layer 311 of the green display unit 32 and the light-emitting functional layer 311 of the blue display unit 33. As shown in FIG. 12B and FIG. 12C, in the embodiment of the disclosure, exemplarily, a red display unit 31 and a green display unit 32 are both provided as the light source during fingerprint identification, and the area of the second electrodes 313 of the red display unit 31 and the green display unit 32 is larger than that of the second electrode 313 of the blue display unit 33. Because the light emitted by the light-emitting functional layer 311 in the display unit 30 to the side of the array substrate 10 will be blocked by the second electrode 313 between the light-emitting functional layer 311 and the fingerprint identification unit 20, and the reflection electrode of the red display unit 31 and the green display unit 32 functioning as the light source of the fingerprint identification unit 20 extends outward if compared with the prior art, thereby blocking the stray light irradiating on the fingerprint identification unit 20, and hence improving the precision of fingerprint identification, that is, the area of the reflection electrode in the blue display unit 33 may be provided constant, and the area of the reflection electrodes in the red display unit 31 and the green display unit 32 may be increased on the basis of the prior art so as to block the stray light. Additionally, the reflection electrode is adjacent to contacts the light-emitting functional layer, therefore, the light emitted by the light-emitting functional layer to the array substrate side is close to the edge of the reflection electrode, and hence the reflection electrode may be provided to extend a certain distance outwardly to block the light emitted by the light-emitting functional layer from directly irradiating on the fingerprint identification unit, and when the reflection electrode extends outwardly to a certain degree, the stray light irradiating on the fingerprint identification unit can be totally blocked, and hence the precision of fingerprint identification can be greatly improved.

In one embodiment, referring to FIG. 12B and FIG. 12C, the ratio of the area of the second electrode 313 of the display unit 30 functioning as the light source of the fingerprint identification unit to the area of the light-emitting functional layer 311 is in a range of 1.2-6, and the ratio of the area of the second electrode 313 of the display unit 30 that does not function as the light source of the fingerprint identification unit 20 to the area of the light-emitting functional layer 311 is in a range of 1-1.2. Exemplarily, referring to FIG. 12B and FIG. 12C, the red display unit 31 and the green display unit 32 function as the light source of the fingerprint identification unit, and the light-tight region 36 in FIG. 12B is the vertical projection of the second electrode 313 of the display unit 30 on the array substrate 10. It may be seen that, compared with the ratio of the area of the light-tight region 36 in the blue display unit 33 to the area of the light-emitting functional layer 311, the ratio of the area of the light-tight region 36 in the red display unit 31 and the green display unit 32 to the area of the light-emitting functional layer 311 is larger, and when the ratio of the area of the first electrode of the display unit functioning as the light source of the fingerprint identification unit to the area of the light-emitting functional layer is provided in a range of 1.2-6, the second electrode can effectively prevent the light emitted by the light-emitting functional layer from directly irradiating on the fingerprint identification unit, that is, stray light can be effectively prevented, the noise during fingerprint detection can be reduced, and the precision of fingerprint identification can be improved. It may be understood that, the larger the ratio of the area of the second electrode of the display unit functioning as the light source of the fingerprint identification unit to the area of the light-emitting functional layer is, the more effectively the second electrode blocks the stray light; when the ratio of the area of the second electrode of the display unit functioning as the light source of the fingerprint identification unit to the area of the light-emitting functional layer is 6, the second electrode can just block most of the stray light, and the precision of fingerprint identification can be greatly improved.

Figure 12D:
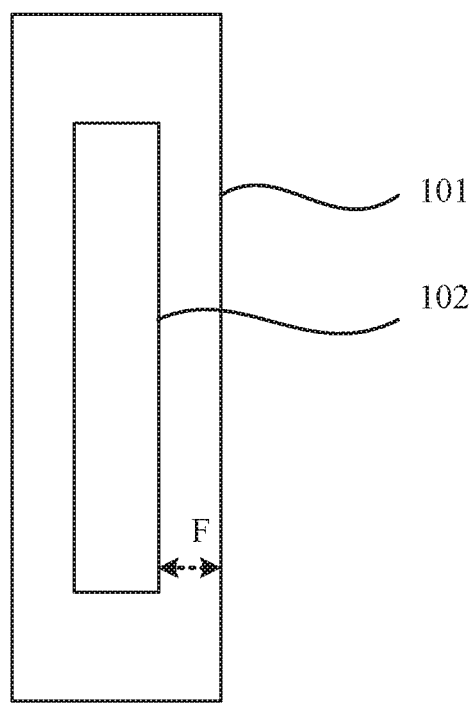
FIG. 12D is a schematic diagram showing the range of distance between a first enclosed coil and a second enclosed coil.

In one embodiment, referring to FIG. 12C-FIG. 12D, the vertical projection of the edge of the second electrode 313 of the display unit 30 functioning as the light source of the fingerprint identification unit 20 on the array substrate 10 forms a first enclosed coil 101, and the vertical projection of the edge of the light-emitting functional layer 311 on the array substrate 10 forms a second enclosed coil 102. FIG. 12D is a schematic diagram showing the range of distance between a first enclosed coil and a second enclosed coil.

Referring to FIG. 12D, the first enclosed coil 101 surrounds the second enclosed coil 102. For each point on the first enclosed coil 101, it is necessarily to have a shortest distance F between the point and a corresponding point on the second enclosed coil 102. The range of distance between the first enclosed coil 101 and the second enclosed coil 102 represents a set of shortest distances F corresponding to all the points on the first enclosed coil 101. The range of distance between the first enclosed coil 101 and the second enclosed coil 102 is 3 µm-30 µm. The range of distance between the first enclosed coil 101 and the second enclosed coil 102 represents the extension degree of the first electrode in any direction in the plane including the first electrode, and when the range of distance between the first enclosed coil 101 and the second enclosed coil 102 is 3 µm-30 µm, stray light can be effectively prevented by the first electrode, thereby improving and the precision of fingerprint identification.

Figure 12E:
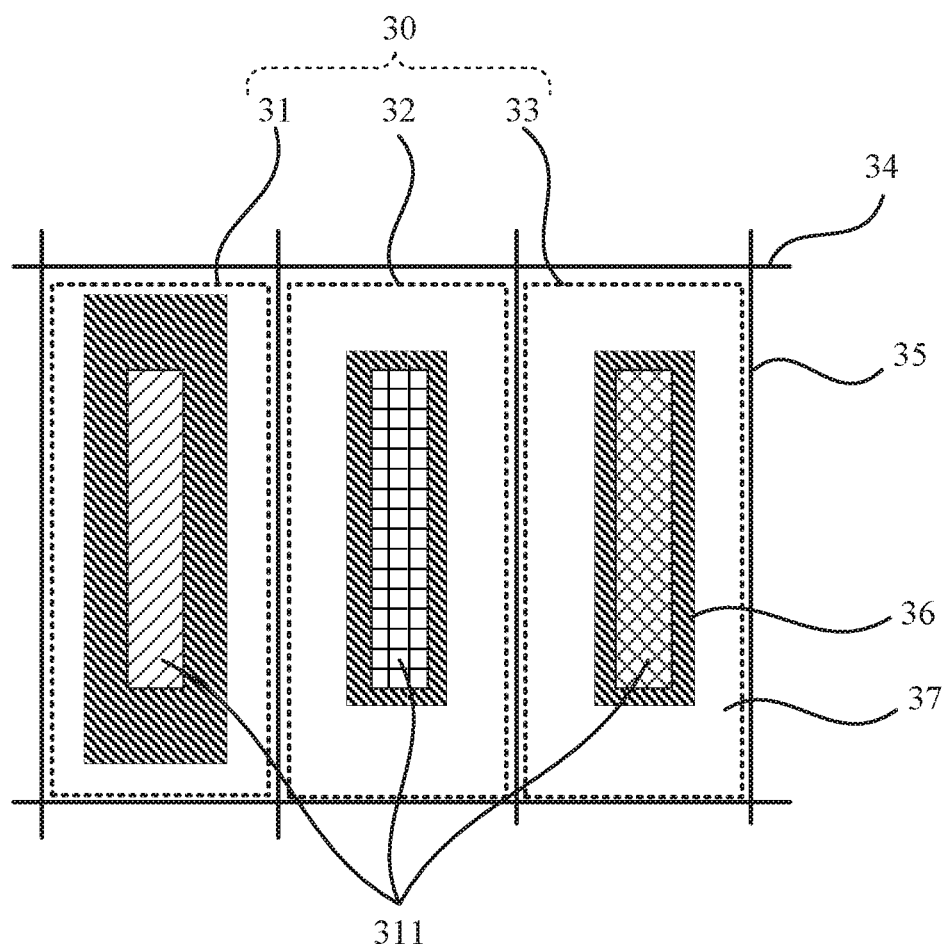
FIG. 12E is a close-up view of another S1 region according to an embodiment of the disclosure.

FIG. 12E is a close-up view of another S1 region according to an embodiment of the disclosure. As shown in FIG. 12E, the light transmission area of the red display unit 31 functioning as the light source of the fingerprint identification unit towards the display side departing from the touch display panel is less than the light transmission area of the blue display unit 33 towards the display side departing from the touch display panel; and the light transmission area of the red display unit 31 functioning as the light source of the fingerprint identification unit towards the display side departing from the touch display panel is less than the light transmission area of the green display unit 32 towards the display side departing from the touch display panel. Because only the red display unit functions as the light source during fingerprint identification, the light emitted by the light-emitting functional layer in the red display unit towards the display side departing from the touch display panel is only needed to be blocked. For example, it only needs to extend the second electrode in the red display unit outwardly without the additional arrangement for the green display unit and the blue display unit. Since the light transmission areas of the green display unit and the blue display unit are both larger than that of the red display unit functioning as the light source, such an arrangement can ensure both the precision of fingerprint identification and the adequate light transmission area to pass the signal light reflected by the touch body (for example, a finger) so as to improve the intensity of the signal light detected on the fingerprint identification unit. Additionally, the intensity of the emergent light from the light source may also be increased by appropriately increasing the working voltage of the red display unit, thereby improving the intensity of the signal light detected on the fingerprint identification unit. In other embodiments, it is possible that only the green display unit is taken as the light source during fingerprint identification. In this case, the light transmission area of the green display unit towards the display side departing from the touch display panel is less than the light transmission area of the blue display unit towards the display side departing from the touch display panel, and the light transmission area of the green display unit towards the display side departing from the touch display panel is less than the light transmission area of the red display unit towards the display side departing from the touch display panel.

Figure 13:
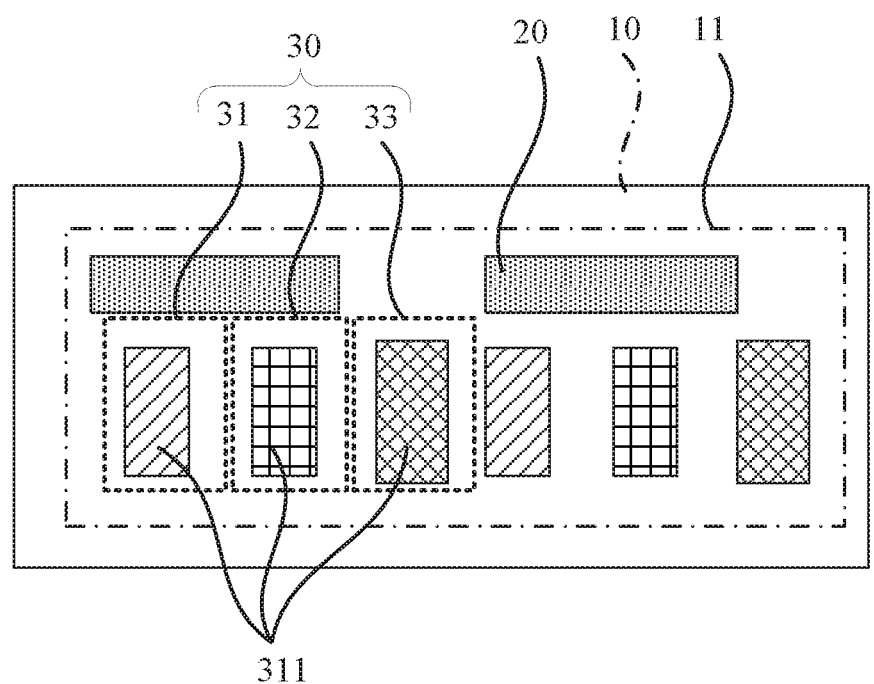
FIG. 13 is a top view showing the structure of another touch display panel according to an embodiment of the disclosure.

FIG. 13 is a top view showing the structure of another touch display panel according to an embodiment of the disclosure. In one embodiment, as shown in FIG. 13, the area of the light-emitting functional layer of the blue display unit 33 is larger than the area of the light-emitting functional layer of the red display unit 31, and the area of the light-emitting functional layer of the blue display unit 33 is larger than the area of the light-emitting functional layer of the green display unit 32. Because the material of the light-emitting functional layer of the blue display unit has a shorter lifetime than the material of the light-emitting functional layer in the red display unit, and the blue display unit, the area of the light-emitting functional layer in the blue display unit is made larger, and hence the light-emitting functional layer of the blue display unit may work at a low voltage, for example, the working voltage of the light-emitting functional layer in the red display unit and the green display unit may be provided as 3V, and the working voltage of the light-emitting functional layer in the blue display unit may be provided as 2V, so that the working life thereof may be prolonged in order to attain a life balance among the red display unit, the green display unit and the blue display unit, hence improving the working life of the whole touch display panel.

Figure 14A:
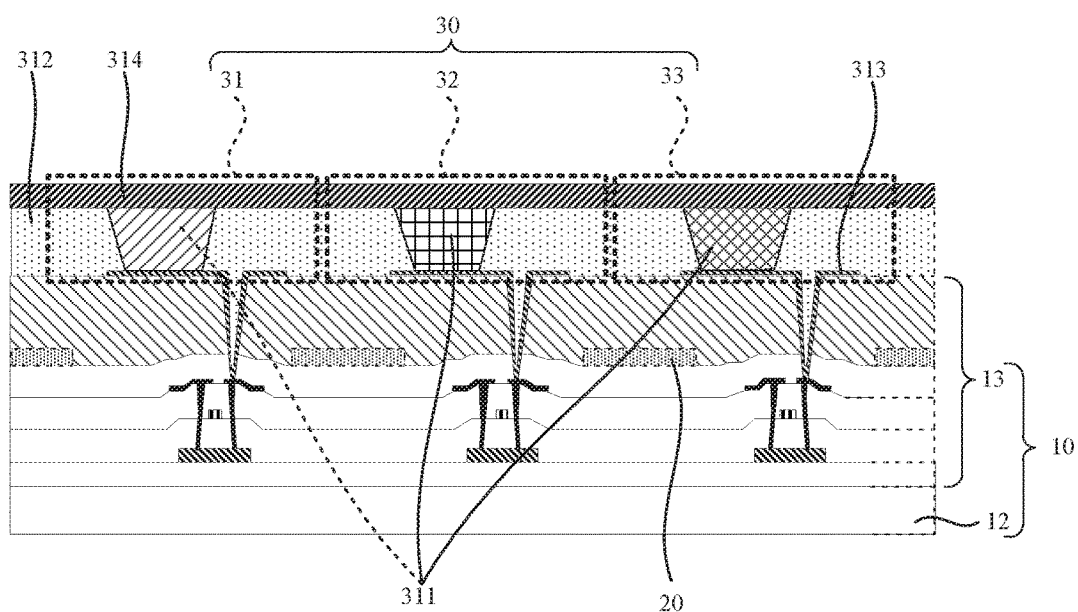
FIG. 14A is a schematic sectional view of another touch display panel according to an embodiment of the disclosure.
Figure 14B:
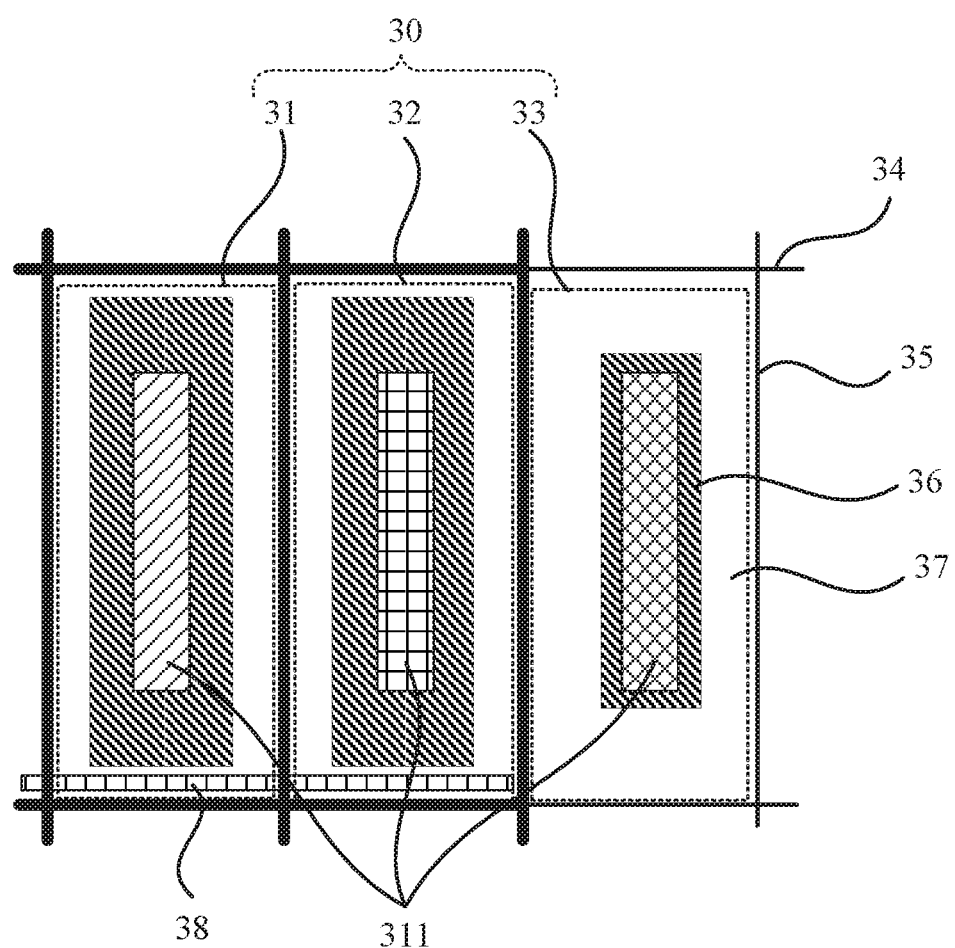
FIG. 14B is a close-up view of another S1 region according to an embodiment of the disclosure.

FIG. 14A is a schematic sectional view of another touch display panel according to an embodiment of the disclosure, and FIG. 14B is a close-up view of another S1 region according to an embodiment of the disclosure. In one embodiment, referring to FIG. 14A, the array substrate 10 includes a second substrate 12 and a plurality of display drive circuits 13 located on the second substrate 12, wherein each display drive circuit 13 is electrically connected with the display unit 30 corresponding thereto, and a fingerprint identification unit 20 is located between the second substrate 12 and the display unit 30. In FIG. 14A, three display drive circuits 13 are provided exemplary, and each of the display drive circuits 13 is electrically connected with a second electrode 313 in the display unit 30, and a fingerprint identification module formed of the fingerprint identification unit 20, a metal connection line and an IC drive circuit (not shown) is embedded inside the touch display panel. In the embodiments of the disclosure, because the fingerprint identification module is embedded inside the touch display panel, the thickness of the display panel may be reduced, thereby achieving a thinning design of the touch display panel.

Specifically, referring to FIG. 14A and FIG. 14B, the scanning line 34 and the data line 35 in the display drive circuit 13 may be widened in the display unit functioning as the light source of the fingerprint identification in order to block stray light. It is also possible that the location or size of the light-tight element in the display drive circuit 13 is changed to block stray light without affecting the original function thereof, for example, leaving its original capacitive storage function, the location of a capacitor metal plate 38 may be changed to block stray light.

Figure 14C:
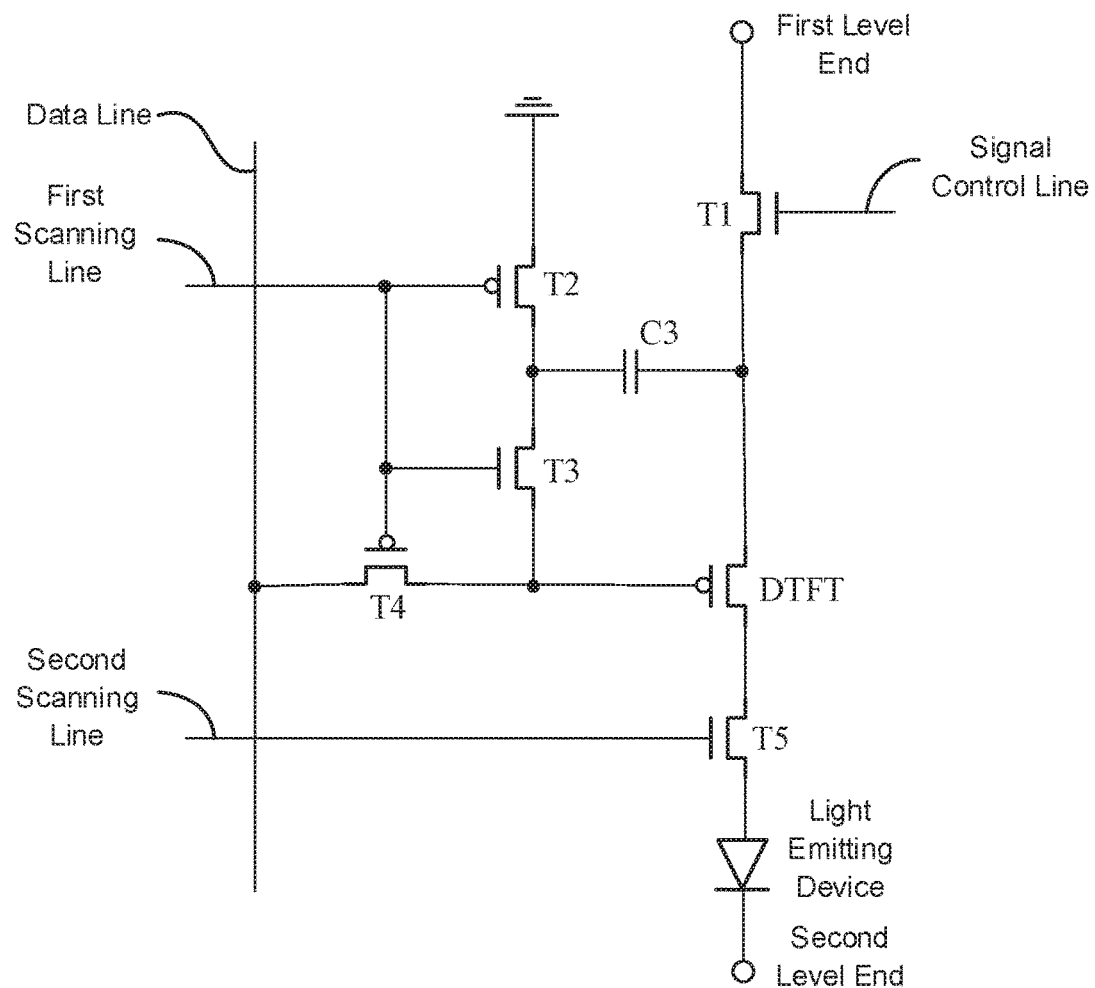
FIG. 14C is a structural representation of a pixel drive circuit according to an embodiment of the disclosure.
Figure 14D:
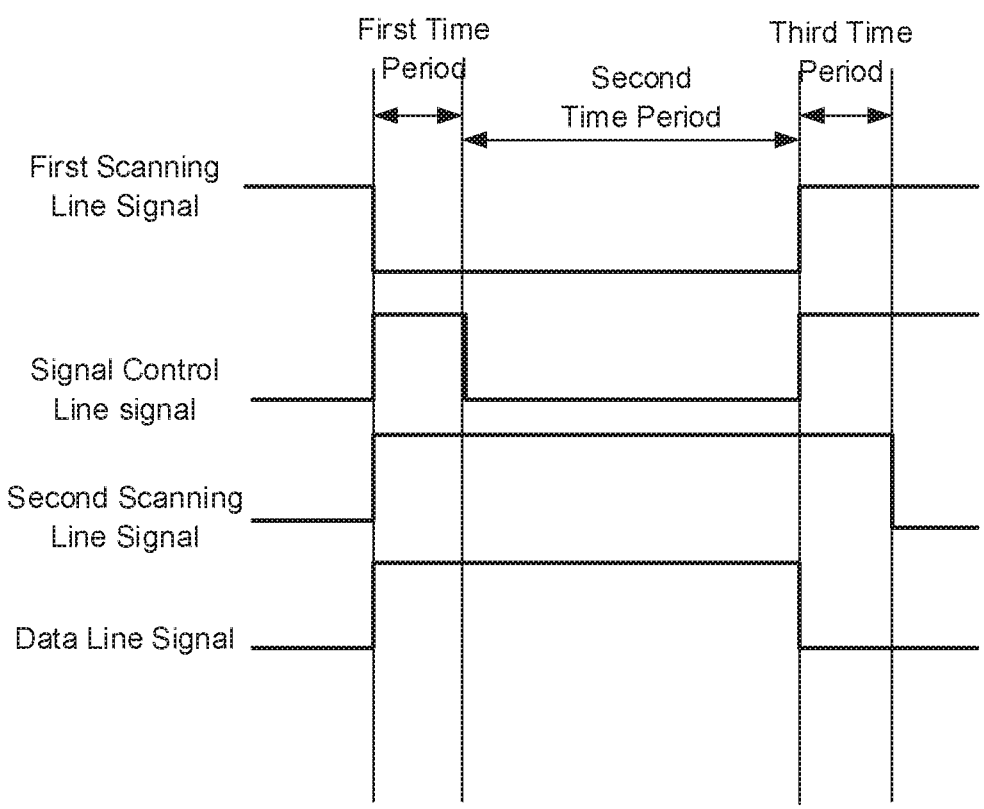
FIG. 14D is a schematic diagram showing the signal time sequence state of a pixel drive circuit according to an embodiment of the disclosure.

FIG. 14C is a structural representation of a display drive circuit according to an embodiment of the disclosure, and FIG. 14D is a schematic diagram showing the signal time sequence state of the display drive circuit according to an embodiment of the disclosure, wherein, the scanning line 34 in FIG. 14B may be a signal control line, a first scanning line and a second scanning line in the display drive circuit according to the embodiment of the disclosure; the data line 35 in FIG. 14B may be a data line in the display drive circuit according to the embodiment of the disclosure; the capacitor metal plate 38 in FIG. 14B may be a first storage capacitor C3 in the display drive circuit according to the embodiment of the disclosure. It may be understood that, a light-tight part such as the gate and source electrodes, etc., of the first switch transistor T1 and the second switch transistor T2 in the display drive circuit may also be utilized to block stray light. Referring to FIG. 14C and FIG. 14D, a display drive circuit according to an embodiment of the disclosure includes a data line, a first scanning line, a second scanning line, a signal control line, a light emitting device, a first storage capacitor C3, a drive transistor DTFT and five switch transistors (T1-T5); a gate electrode of the first switch transistor T1 is connected with the signal control line, a source electrode of the first switch transistor T1 is connected a the first level end, and a drain electrode of the first switch transistor T1 is connected with a first electrode of the first storage capacitor C3; a gate electrode of the second switch transistor T2 is connected with the first scanning line, a source electrode of the second switch transistor T2 is grounded, a drain electrode of the second switch transistor T2 is connected with a second electrode of the first storage capacitor C3; a gate electrode of the third switch transistor T3 is connected with the first scanning line, and a source electrode of the third switch transistor T3 is connected with the second electrode of the first storage capacitor C3; a gate electrode of the fourth switch transistor T4 is connected with the first scanning line, a source electrode of the fourth switch transistor T4 is connected with the data line, and a drain electrode of the fourth switch transistor T4 is connected with the drain electrode of the third switch transistor T3; a gate electrode of the drive transistor DTFT is connected with the drain electrode of the fourth switch transistor T4, and a source electrode of the drive transistor DTFT is connected with the first electrode of the first storage capacitor C3; a gate electrode of the fifth switch transistor T5 is connected with the second scanning line, a source electrode of the fifth switch transistor T5 is connected with a drain electrode of the drive transistor DTFT, a drain electrode of the fifth switch transistor T5 is connected with one terminal of the light emitting device, and the other terminal of the light emitting device is connected with a second level end.

The first switch transistor T1, the third switch transistor T3 and the fifth switch transistor T5 are N-type switch transistors; and, the drive transistor DTFT, the second switch transistor T2 and the fourth switch transistor T4 are P-type switch transistor.

A drive method of the display drive circuit according to the embodiment of the disclosure is as follows:

In the first time period, the first switch transistor T1, the second switch transistor T2, the fourth switch transistor T4 and the fifth switch transistor T5 are turned on, the third switch transistor T3 is cut off, and the first level end charges the first storage capacitor C3;

In a second time period, the second switch transistor T2, the fourth switch transistor T4 and the fifth switch transistor T5 are turned on, the first switch transistor T1 and the third switch transistor T3 are cut off, and the first storage capacitor C3 discharges until the voltage difference between the gate electrode and the source electrode of the drive transistor DTFT equals to the threshold voltage of the drive transistor DTFT;

In a third time period, the first switch transistor T1, the third switch transistor T3 and the fifth switch transistor T5 are turned on, the second switch transistor T2 and the fourth switch transistor T4 are cut off, and the first level end and the second level end apply a turn-on signal to the light emitting device.

The fifth switch transistor T5 may be cut off after the display process is finished, so that the light emitting can be protected.

Figure 15A:
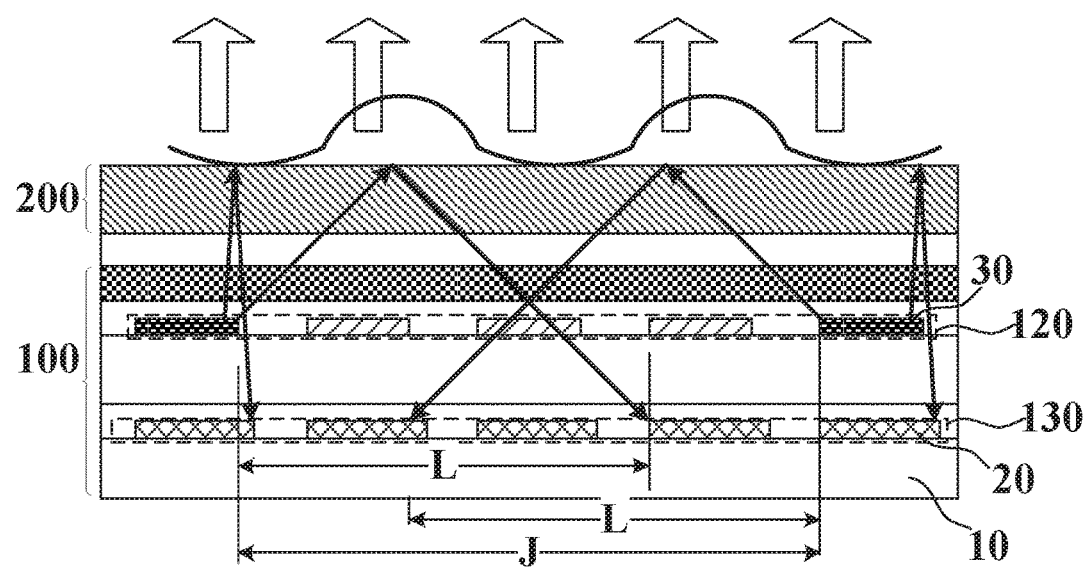
FIG. 15A is a schematic diagram of a display device according to an embodiment of the disclosure.
Figure 15B:
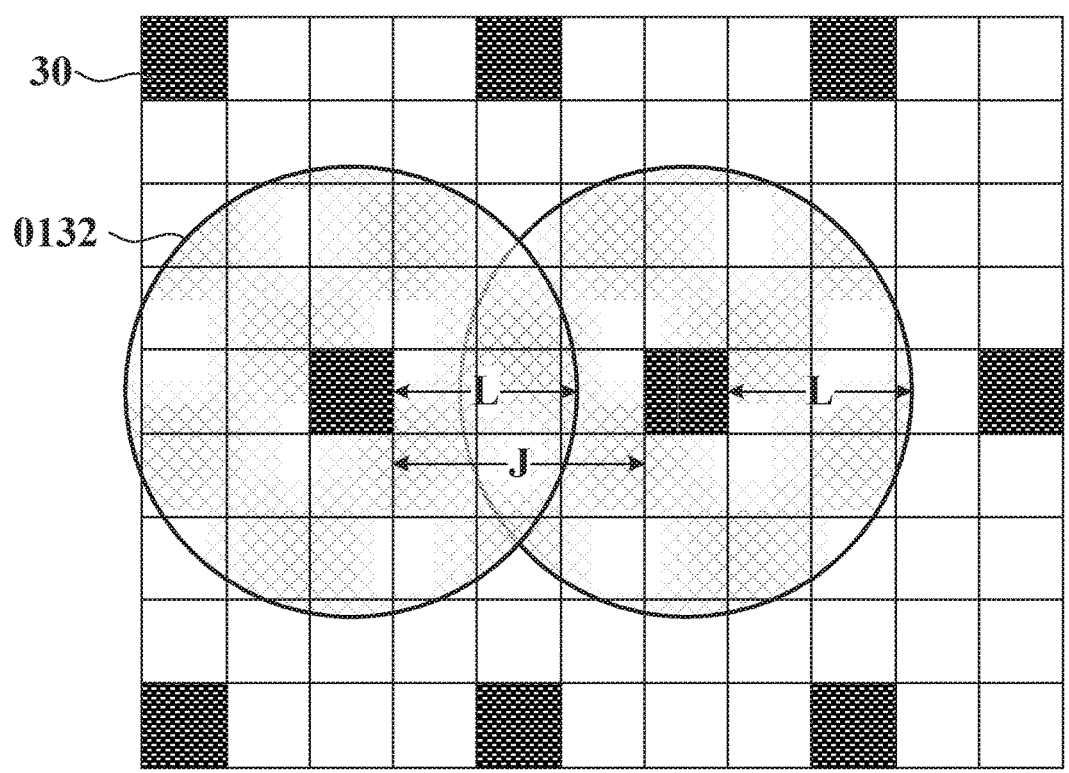
FIG. 15B is a partial top view of the display device shown in FIG. 15A.
Figure 15C:
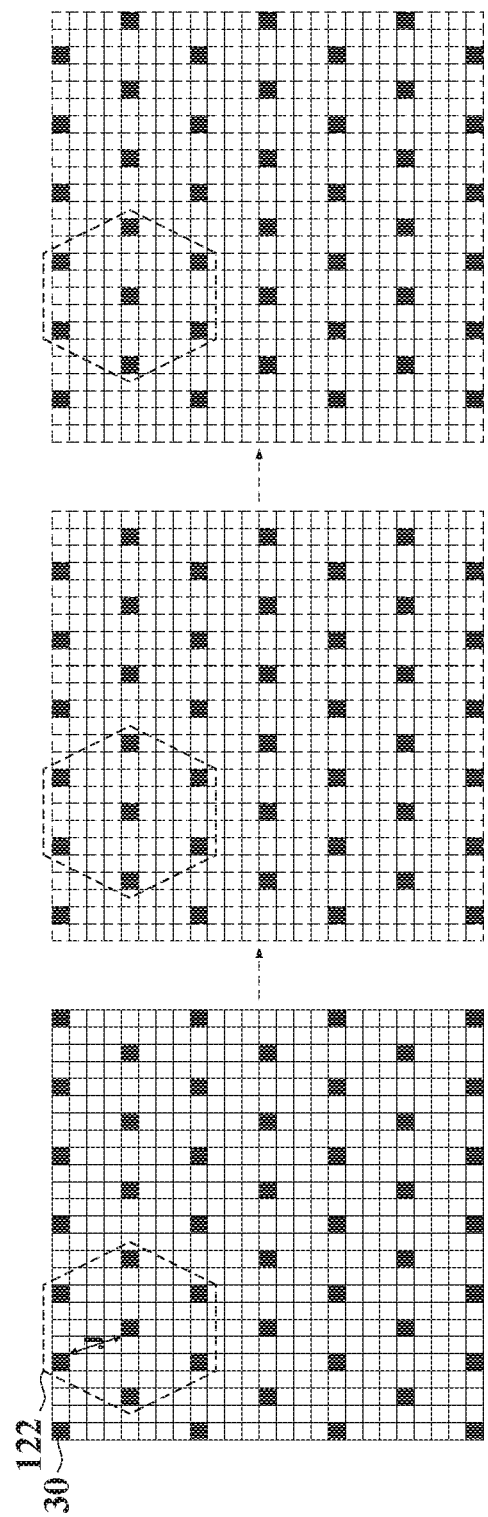
FIG. 15C is a schematic scanning graph of a fingerprint identification stage of the display device shown in FIG. 15A.

FIG. 15A is a schematic diagram of a display device according to an embodiment of the disclosure, FIG. 15B is a partial top view of the display device shown in FIG. 15A, and FIG. 15C is a schematic scanning graph of a fingerprint identification stage of the display device shown in FIG. 15A. The display device according to the embodiment of the disclosure includes: a display panel 100 and a cover plate 200 located on the display panel 100, wherein, the display panel 100 includes an array substrate 10, an organic light emitting layer 120 located on one side of the array substrate 10 that faces the cover plate 200, and a fingerprint identification array 130, wherein the organic light emitting layer 120 includes a plurality of display units 30, the first surface of the cover plate 200 that is facing away from the array substrate 10 is an emergent light surface of the display device; in the fingerprint identification stage, a plurality of display units 30 displace and emit light according to a first luminous dot matrix 122. The distance J between any adjacent two display units 30 in the first luminous dot matrix 122 is larger than or equal to the minimum crosstalk-free distance L, wherein the minimum crosstalk-free distance L is the maximum radius of the cover region 0132 formed on the fingerprint identification array 130 by reflecting the light emitted from any display unit 30 by the first surface of the cover plate 200.

Figure 16:
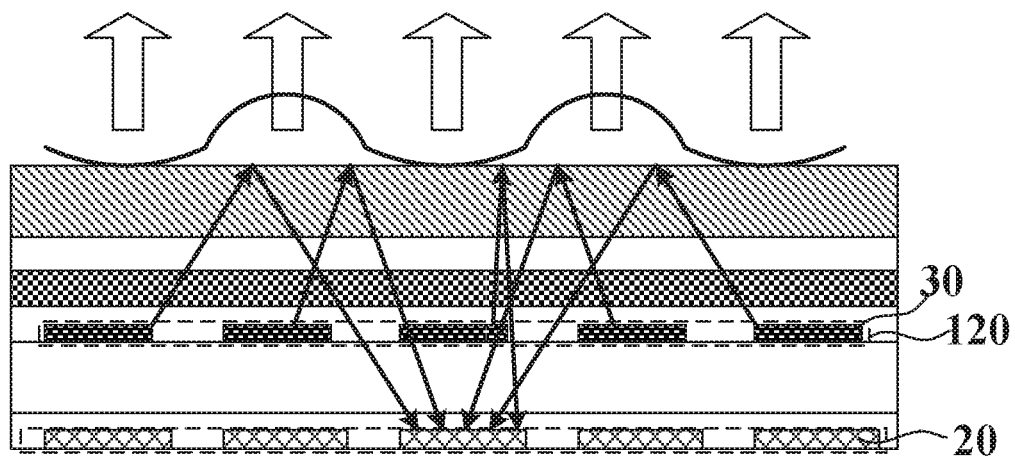
FIG. 16 is a schematic diagram showing the crosstalk of a display device.

In the display device according to the embodiment of the disclosure, the display panel 100 is employed as a fingerprint identification light source for fingerprint identification. Specifically, the display unit 30 of the organic light emitting layer 120 in the display panel 100 is employed as the light source of the fingerprint identification unit 20 for fingerprint identification. When a finger of a user is pressed on the first surface of the cover plate 200, the light emitted from the display unit 30 passes through the first surface of the cover plate 200 and irradiates on the finger of the user, the light is reflected by the fingerprint of the user finger and forms a reflected light, and the fingerprint reflection light irradiates from the first surface of the cover plate 200 onto the fingerprint identification unit 20 corresponding to the display unit 30 that emits light, the fingerprint identification unit 20 that receives the fingerprint reflection light generates an inductive signal, and the fingerprint identification circuit of the display device can perform fingerprint identification according to the inductive signal. The reason that the first luminous dot matrix 122 is taken as the detection light source of the fingerprint identification unit 20 lies in that the light emitted from the display unit 30 has a large range of angle distribution. As shown in FIG. 16, in the display device, if all the display units 30 of the organic light emitting layer 120 emit light simultaneously for fingerprint identification, each fingerprint identification unit 20 will receive, in addition to the fingerprint reflection light from the corresponding display unit 30, crosstalk signals from a plurality of other display units 30, so that the precision of fingerprint identification will be low.

To improve the precision of fingerprint identification, in the display device according to this embodiment, in the fingerprint identification stage, a plurality of display units 30 displace and emit light according to a first luminous dot matrix 122, the distance J between any adjacent two display units 30 in the first luminous dot matrix 122 is larger than or equal to the minimum crosstalk-free distance L. As shown in FIG. 15A and FIG. 15B, the light emitted from the display unit 30 has an angle distribution, so that the light emitted by the display unit 30 will form a cover region 0132 on the fingerprint identification array 130 after being reflected by the first surface of the cover plate 200, the fingerprint reflection light for light emitted at any angle by the display unit 30 will all fall into the cover region 0132, wherein, the maximum radius of the cover region 0132 will be the minimum crosstalk-free distance L. In this embodiment, the distance J between any adjacent two display units 30 in the first luminous dot matrix 122 is larger than or equal to the minimum crosstalk-free distance L, so that the fingerprint reflection light of any display unit 30 will never irradiate on the fingerprint identification unit 20 corresponding to other display units 30 that emit light simultaneously, that is, the fingerprint identification unit 20 corresponding to any display unit 30 in the first luminous dot matrix 122 can only receive the fingerprint reflection light of a display unit 30 corresponding thereto. Therefore, in the display device according to this embodiment, the fingerprint identification unit 20 will not be affected by the crosstalk signals from other display units, and the fingerprint identification circuit of the corresponding display device is able to perform fingerprint identification according to the inductive signal generated by said fingerprint identification unit 20, thereby improving the precision of fingerprint identification of the display device.

It is noted that, the fingerprint reflection light is the reflected light formed by reflecting the emergent light of the display unit 30 via the fingerprint of the user finger that is pressed on the first surface of the cover plate 200, the distance between the fingerprint of the user finger and the first surface of the cover plate 200 is very small relative to the thickness of the display device, so that there is little affection on the range of the cover region 0132. Therefore, in this embodiment, the reflection distance between the user finger and the first surface of the cover plate 200 is neglected during the arrangement of the minimum crosstalk-free distance L. Additionally, the radius L of the cover region 0132 may be substantially calculated by taking the center point of the display unit 30 as the initial point; however, in fact, the display device has a very larger number of display units 30, so that the size of the display unit 30 is very small. Therefore, in this embodiment, the display unit 30 as a whole may be taken as the initial point of the cover region 0132, and in this case the radius L of the cover region 0132 may be represented by the length from the edge of the display unit 30 to the edge of the cover region 0132, and the size of the display unit 30 may not be accounted for the minimum crosstalk-free distance L. It may be understood by one skilled in the art that, the minimum crosstalk-free distance L is related to the factors such as the thickness of the display device and the emergent light angle of the display unit, and thus different display devices may have different values of minimum crosstalk-free distance L. In other embodiments, the size of the display unit may be accounted for in the minimum crosstalk-free distance, which is not specifically limited in the disclosure.

As indicated above, the light emitted from the display unit 30 has an angle distribution, and the minimum crosstalk-free distance L is the maximum radius of the cover region 0132 formed on the fingerprint identification array 130 by reflecting the light emitted from any display unit 30 by the first surface of the cover plate 200. Apparently, the range defined on the fingerprint identification array 130 by the reflected light of the light with the maximum angle emitted from the edge of the display unit 30 will be the cover region 0132, and the reflected light of the light with any angle emitted by the display unit 30 will fall into the cover region 0132.

Figure 15D:
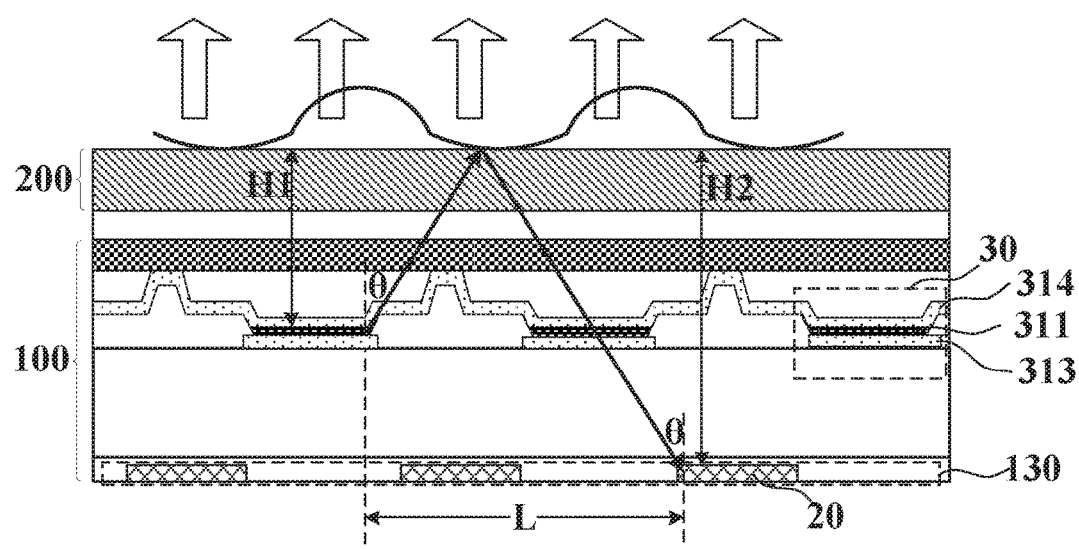
FIG. 15D is a specific structural representation of FIG. 15A.

As shown in FIG. 15D, the reflection of a signal by a fingerprint is basically mirror reflection, wherein reflection angle=incident angle. Thus, it may be known that $L=\tan\theta*H1+\tan\theta*H2$, wherein, L is the minimum crosstalk-free distance, $\theta$ is an included angle between the direction corresponding to the preset brightness of the display unit 30 and the direction vertical to the organic light emitting layer, H1 is the height from the first surface of the cover plate 200 to the light-emitting functional layer in the direction vertical to the display device, H2 is the height from the first surface of the cover plate 200 to the fingerprint identification array 130 in the direction vertical to the display device, and the preset brightness is less than or equals to 10% of the brightness in the direction vertical to the organic light emitting layer.

In this embodiment, the angle of the light emitted from the display unit 30 is related to the brightness of the display unit 30, wherein brightness is a subjective feeling to the (achromatic) luminous intensity. In this embodiment, the brightness of the display unit 30 in the vertical direction is defined as 100%, the lower the brightness percentage is, the larger the corresponding emergent light angle (the included angle with the direction vertical to the organic light emitting layer) will be, and the weaker the corresponding luminous intensity will be. However, when the brightness of the display unit 30 is less than or equals to 10%, the luminous intensity of the light emitted from the display unit 30 will be very weak, and the reflected light thereof formed on the first surface of the cover plate 200 will not cause a crosstalk to the fingerprint identification unit 20, therefore, in this embodiment, a brightness of 10% is provided as the critical value for the emergent light angle of the display unit 30. Based on this, the process for determining θ is as follows: the brightness of the display unit 30 in the vertical direction is measured, the location corresponding to 10% of the brightness in the direction vertical to the organic light emitting layer is determined, and θ is determined according to an included angle between the direction of the location and the direction vertical to the organic light emitting layer. It may be understood by one skilled in the art that, the luminous intensities of the display units of different display devices may be different, and the value of the corresponding preset brightness may also be different, for example, in other embodiments, the value of the preset brightness may be selected as 12% or 9%, etc., of the brightness in the direction vertical to the organic light emitting layer, which is not specifically limited in the disclosure.

In the schematic scanning graph of the display device as shown in FIG. 15C, in the fingerprint identification stage, the display device employs picture scanning for fingerprint identification. Specifically, the display units 30 are lighted at the same time according to the first luminous dot matrix 122, and inductive signals generated by the fingerprint identification units 20 at the locations corresponding to the lighted display units 30 are recorded; in the next picture, the display units 30 lighted at the same time are displaced, and the corresponding inductive signals are recorded, until all the display units 30 are lighted circularly, and fingerprint identification is performed according to the obtained inductive signal of each fingerprint identification unit 20. Because the fingerprint identification unit 20 in this embodiment will not be affected by crosstalk signals, the precision of fingerprint identification will be very high. It may be understood by one skilled in the art that, the first luminous dot matrix may be a minimum repeating unit formed by a plurality of display units that emit light simultaneously, rather than being limited to a dot matrix formed by a plurality of display units that emit light simultaneously.

In the display device according to the embodiment of the disclosure, in the fingerprint identification stage, a plurality of display units displace and emit light according to the first luminous dot matrix, the distance between any adjacent two display units in the first luminous dot matrix is larger than or equal to the minimum crosstalk-free distance, wherein the minimum crosstalk-free distance is the maximum radius of the cover region formed on the fingerprint identification array by reflecting the light emitted from any display unit by the first surface of the cover plate. Apparently, the fingerprint reflection light of any display unit that emits light in the first luminous dot matrix will never irradiate on the fingerprint identification unit corresponding to other display units that emit light simultaneously, that is, the fingerprint identification unit corresponding to any display unit in the first luminous dot matrix can only receive fingerprint reflection light of a display unit corresponding thereto. Therefore, the fingerprint identification unit will not be affected by the crosstalk signals from other display units, and the fingerprint identification circuit of the corresponding display device performs fingerprint identification according to the inductive signal generated by the fingerprint identification unit, thereby improving the precision of fingerprint identification of the display device.

It is noted that, the display device shown in FIG. 15A only shows a structure of a display device according to the disclosure. In other embodiments of the disclosure, display devices with various different structures are further provided.

Figure 17:
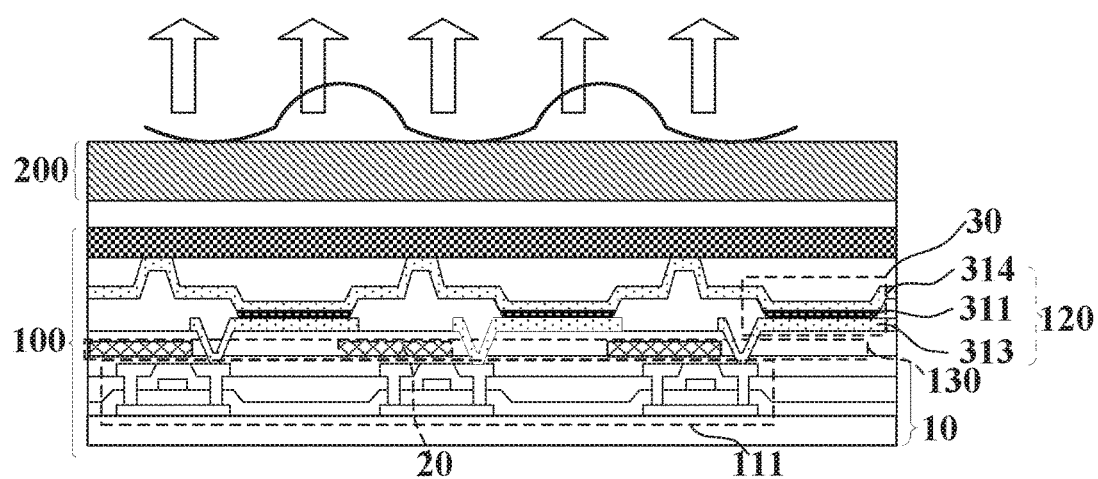
FIG. 17 is a schematic diagram showing a second type of display device according to an embodiment of the disclosure.

One embodiment of the disclosure further provides a second type of display device, and the difference between this display device and the display device shown in FIG. 15A only lies in that the structures are different. Specifically, in the display device as shown in FIG. 17, a thin-film transistor array 111, a fingerprint identification array 130 and an organic light emitting layer 120 are laminated on one side of the array substrate 10 that faces the cover plate 200. As shown in FIG. 17, the fingerprint identification array 130 is provided between the thin-film transistor array 111 and the organic light emitting layer 120, the fingerprint identification array 130 and the thin-film transistor array 111 are laminated in an insulated way, and the fingerprint identification array 130 and the organic light emitting layer 120 are laminated in an insulated way. The fingerprint identification process of this display device is similar to that of the display device shown in FIG. 15A, and it will not be described again here. It needs to be noted that, the fingerprint identification array 130 is provided between the thin-film transistor array 111 and the organic light emitting layer 120, so that this will not affect the aperture ratio of the second electrode 313 in the display unit 30. Therefore, the arrangement mode of the fingerprint identification unit 20 in the fingerprint identification array 130 may be determined as is possibly necessary by the product, which will not be specifically defined in the disclosure.

Figure 18:
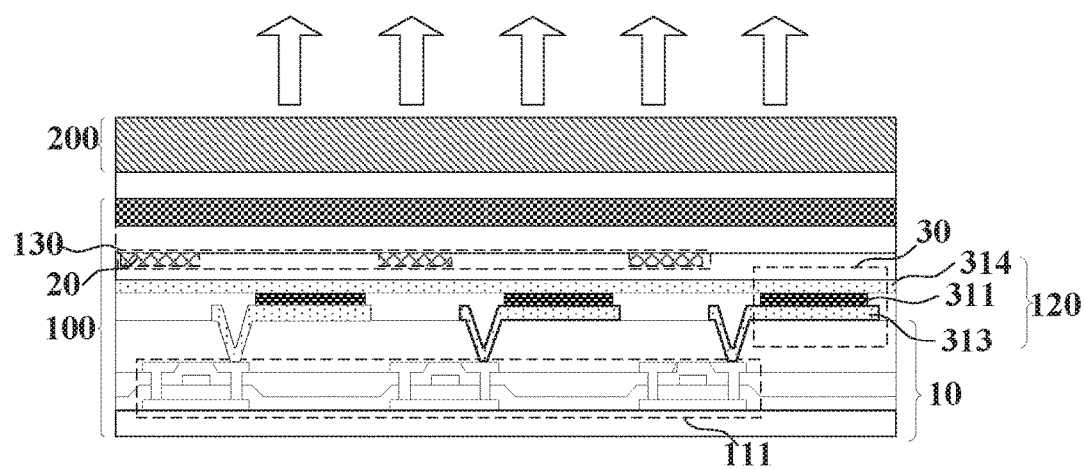
FIG. 18 is a schematic diagram showing a third type of display device according to an embodiment of the disclosure.

One embodiment of the disclosure further provides a third type of display device, and the difference between this display device and any of the above display devices only lies in that the structures are different. Specifically, as shown in FIG. 18, the fingerprint identification array 130 is provided on one lateral side of the organic light emitting layer 120 that faces the cover plate 200, and the fingerprint identification array 130 and the organic light emitting layer 120 are laminated in an insulated way. The fingerprint identification process of this display device is similar to that of the display device shown in FIG. 15A, and it will not be described again here. It needs to be noted that, the fingerprint identification array 130 is provided on one lateral side of the organic light emitting layer 120 that faces the cover plate 200. In order to prevent from lowering the aperture ratio of the second electrode 313 in the display unit 30, the projection of the fingerprint identification unit 20 in the fingerprint identification array 130 in a direction vertical to the display device is located in a non-display region of the organic light emitting layer 120.

Figure 19A:
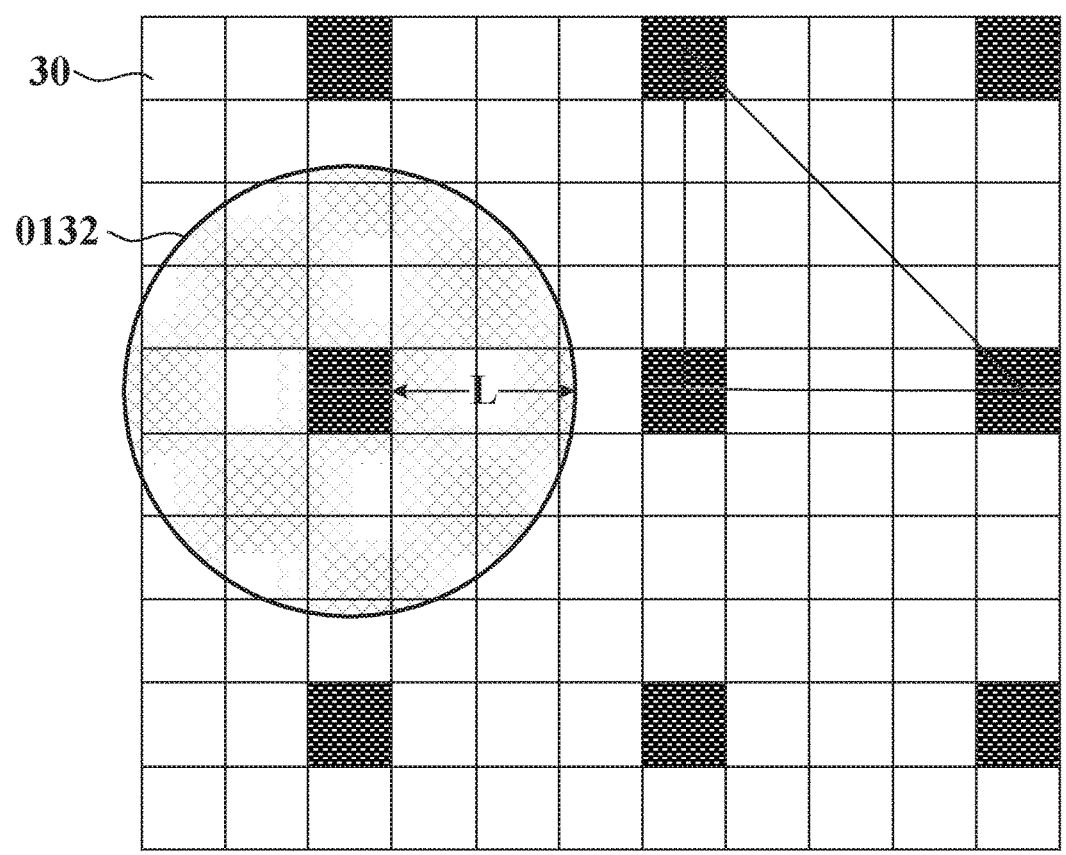
FIG. 19A is a schematic scanning graph of a fingerprint identification stage of another display panel according to an embodiment of the disclosure.

It needs to be noted that, the display device reads the fingerprint information in a picture scanning mode, and in one frame of picture, the display unit 30 is controlled to emit light according to the first luminous dot matrix 122 and acquire a fingerprint signal of the fingerprint identification unit 20 corresponding to the display unit 30 that emits light; in the next frame of picture, the display unit 30 that emits light displaces; the display units 30 that emit light displace successively until all the display units 30 are lighted via a plurality of frames of pictures. Apparently, the display device reads the fingerprint information via a plurality of frames of pictures; however, if the number of the display units 30 lighted in one frame of picture is small, the number of frames of pictures for reading the fingerprint information may be large, and the time necessary for reading the fingerprint information may be long. For example, if the display device reads the fingerprint information in the picture scanning mode as shown in FIG. 19A, wherein the number of display units 30 that emit light at the same time in one frame of picture (11*10 display units) is 9, at least 12 frames of pictures need to be scanned for reading the fingerprint information of the fingerprint identification unit 20 of all the display units 30, wherein the time for reading the fingerprint information of each frame of picture is fixed.

Figure 19B:
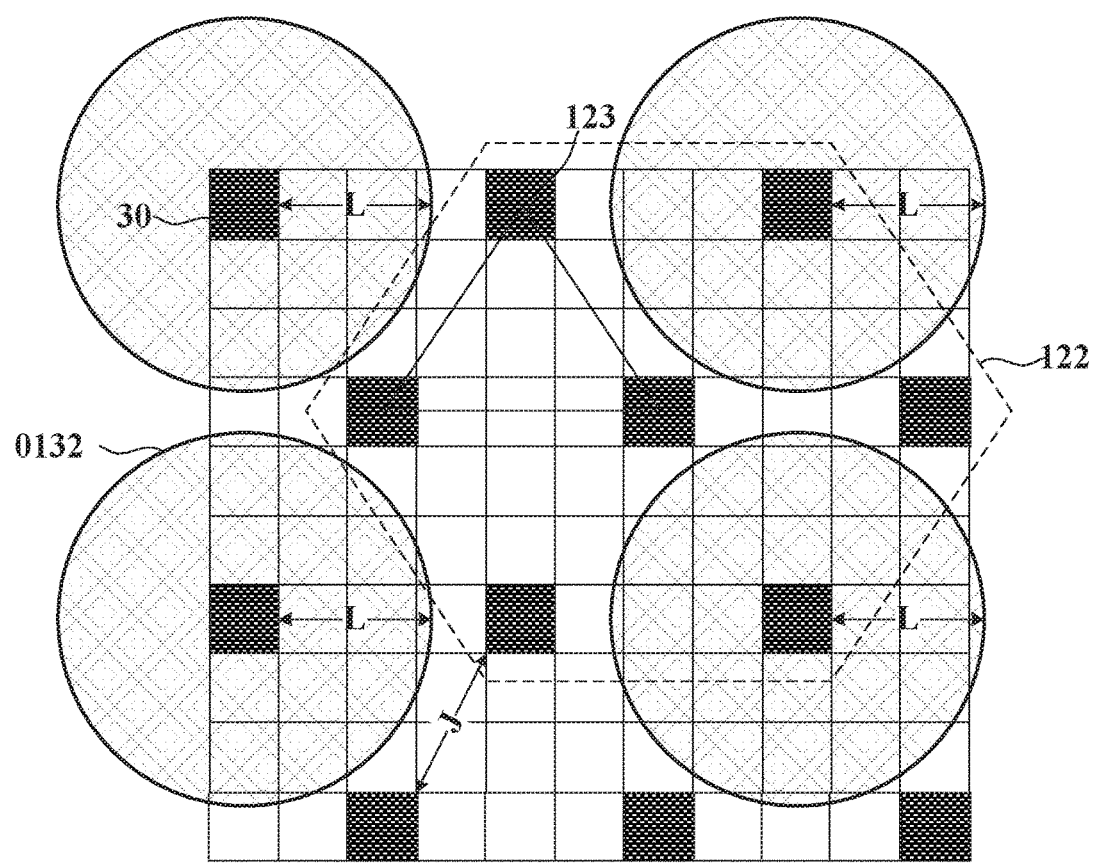
FIG. 19B is a schematic scanning graph of a fingerprint identification stage of another display panel according to an embodiment of the disclosure.

In order to reduce the time needed for reading a fingerprint, as shown in FIG. 19B, a plurality of display units 30 of the first luminous dot matrix 122 form a plurality of patterns. As shown in FIG. 19B, each angle of the pattern 123 with the minimum area among the plurality of patterns does not equal to 90°. Apparently, in comparison with FIG. 19A, the distance J between adjacent two display units 30 that emit light in the first luminous dot matrix 122 is somewhat reduced, so that the number of display units 30 lighted in one frame of picture is large. Specifically, the number of display units 30 that emit light at the same time in one frame of picture (11*10 display units) is 12, so that at most 10 frames of pictures need to be scanned for reading the fingerprint information of the fingerprint identification unit 20 of all the display units 30. A plurality of display units 30 of the first luminous dot matrix 122 form a plurality of patterns, and each angle of the pattern 123 with the minimum area among the plurality of patterns does not equal to 90°. In this case, the number of the display units 30 lighted at the same time can be improved without signal crosstalk, thereby significantly reducing the time needed for reading a fingerprint.

Figure 20A:
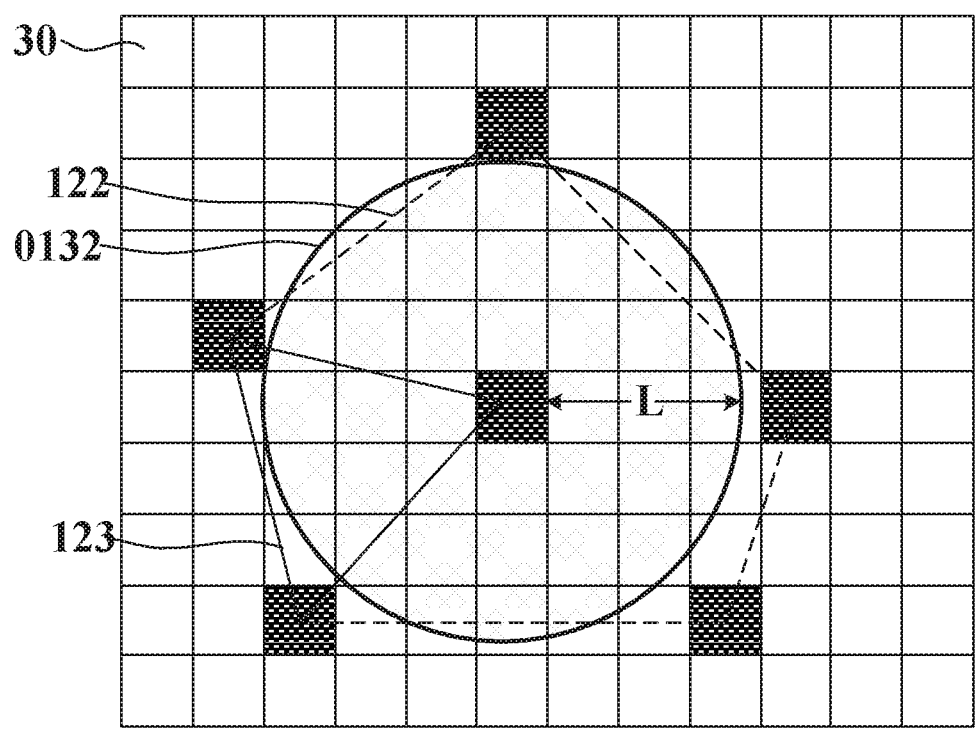
FIG. 20A is a schematic diagram showing a first luminous dot matrix according to an embodiment of the disclosure.

Exemplarily, based on the display device according to any of the above embodiments, as shown in FIG. 20A, the first luminous dot matrix 122 is a pentagonal luminous dot matrix, which includes one center display unit 30 and five edge display units 30. A plurality of display units 30 of the first luminous dot matrix 122 form a plurality of patterns, and each angle of the pattern 123 with the minimum area among the plurality of patterns does not equal to 90°. By the pentagonal luminous dot matrix, the number of the display units 30 lighted at the same time can be improved without signal crosstalk, thereby reducing the time needed for reading a fingerprint.

Figure 20B:
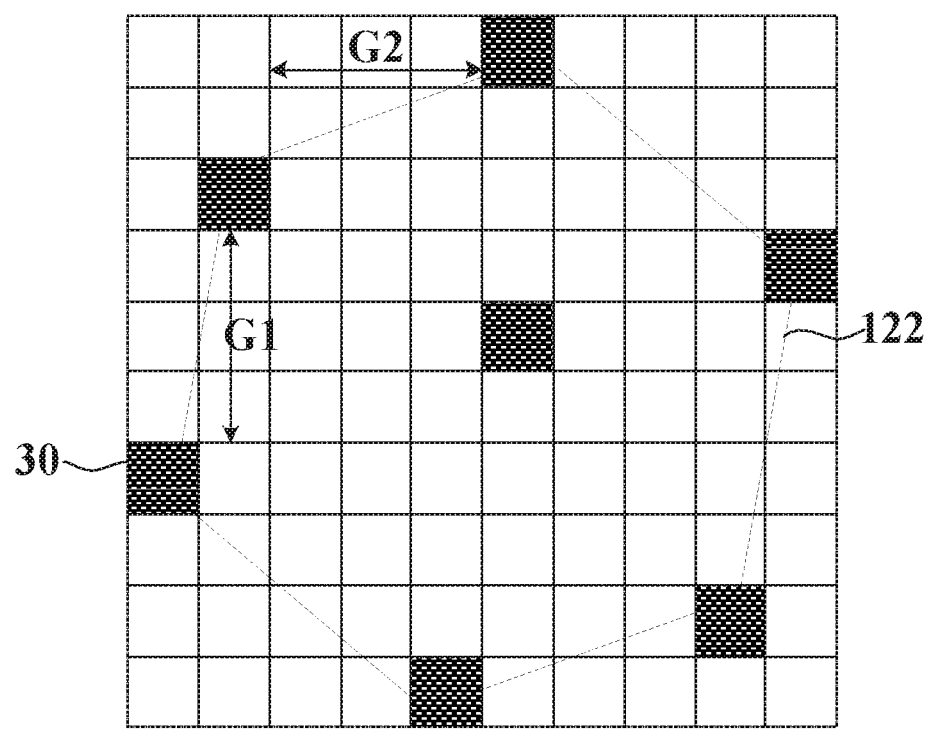
FIG. 20B is a schematic diagram showing another first luminous dot matrix according to an embodiment of the disclosure.

Exemplarily, based on the display device according to any of the above embodiments, as shown in FIG. 20B, the first luminous dot matrix 122 is a hexagonal luminous dot matrix, which includes one center display unit 30 and edge display units 30. By the hexagonal luminous dot matrix, the number of the display units 30 lighted at the same time can be improved without signal crosstalk, thereby reducing the time needed for reading a fingerprint.

Figure 20C:
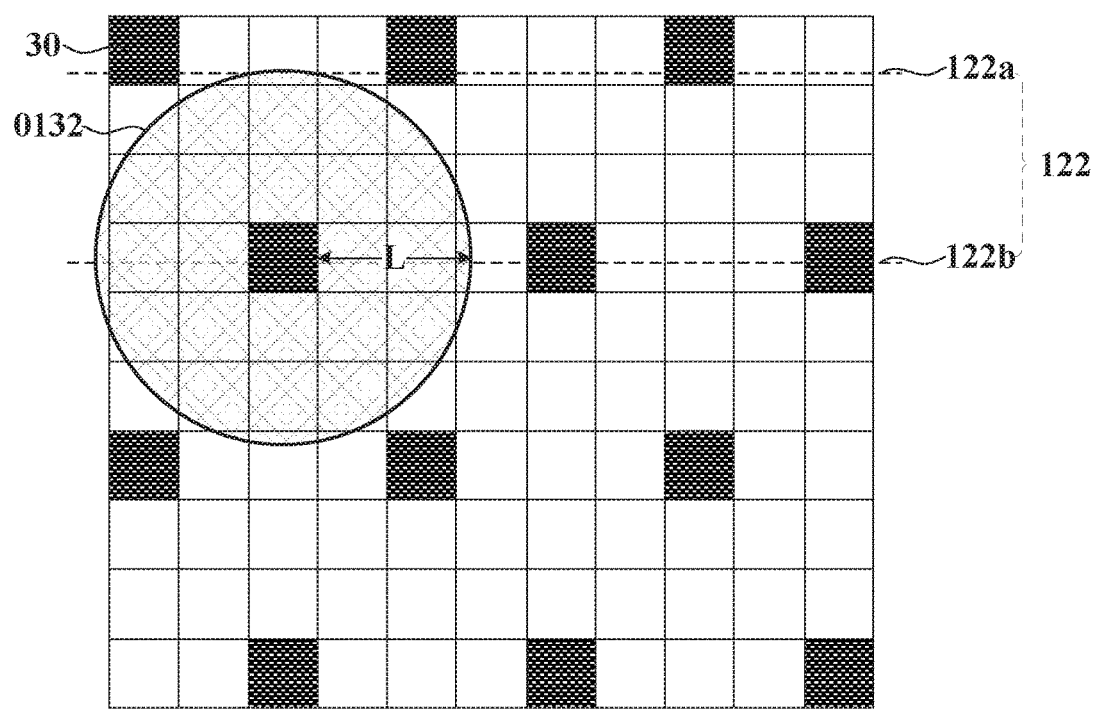
FIG. 20C is a schematic diagram showing another first luminous dot matrix according to an embodiment of the disclosure.

Exemplarily, based on the display device according to any of the above embodiments, as shown in FIG. 20C, the first luminous dot matrix 122 includes a first luminous row 122a and a second luminous row 122b that are spaced apart from each other, wherein any display unit 30 in the first luminous row 122a and any display unit 30 in the second luminous row 122b are located in different columns. In comparison with the scanning mode shown in FIG. 19A, any display unit 30 in the first luminous row 122a and any display unit 30 in the second luminous row 122b are located in different columns, so that the number of the display units 30 lighted at the same time can be improved without signal crosstalk, wherein the number of display units 30 that emit light at the same time in one frame of picture (11*10 display units) is 12, so that at most 10 frames of pictures need to be scanned for reading the fingerprint information of the fingerprint identification unit 20 of all the display units 30, thereby significantly reducing the time needed for reading a fingerprint.

For any first luminous dot matrix 122 provided in any of the above embodiments, the distance J between any adjacent two display units 30 in the first luminous dot matrix 122 equals to the minimum crosstalk-free distance L. Apparently, the fingerprint identification unit 20 corresponding to each display unit 30 that emits light in the first luminous dot matrix 122 will not be affected by the crosstalk signals from other display units 30 that emit light simultaneously, so that the accuracy of fingerprint signal may be guaranteed; Also, the distance J between any adjacent two display units 30 in the first luminous dot matrix 122 equals to the minimum crosstalk-free distance L, so that the number of display units 30 lighted at the same time may be made larger, thereby reducing the time necessary for reading a fingerprint signal, and improving the fingerprint read efficiency.

For any first luminous dot matrix 122 provided in any of the above embodiments, for any adjacent two display units 30 located on different rows in the first luminous dot matrix 122, the vertical distance G1 from one display unit 30 to the row including another display unit 30 (shown in FIG. 20B) is less than the minimum crosstalk-free distance L; and/or, for any adjacent two display units 30 located in different columns in the first luminous dot matrix 122, the vertical distance G2 from one display unit 30 to the column including another display unit 30 (shown in FIG. 20B) is less than the minimum crosstalk-free distance L. With such the first luminous dot matrix 122 may guarantee that the fingerprint identification unit 20 corresponding to the display unit 30 that emits light will not be affected by the crosstalk signals from other display units 30 that emit light simultaneously, so that the accuracy of fingerprint identification can be improved; Also, the number of display units 30 lighted at the same time may be made larger, thereby reducing the time necessary for reading a fingerprint signal, and improving the fingerprint read efficiency.

In order to more clearly illustrate the fingerprint read efficiency of the display device according to the embodiment of the disclosure, the fingerprint read efficiency of the display device according to the embodiment of the disclosure will be described taking a square array scanning mode and a hexagonal array scanning mode as an example. It is provided that crosstalk can only be avoided when the distance between adjacent display units 30 lighted in a scanned picture at least reaches above 20 display units 30 (the distance between the centers of two display units), and specifically, the length of 20 display units 30 is 20P.

Figure 21A:
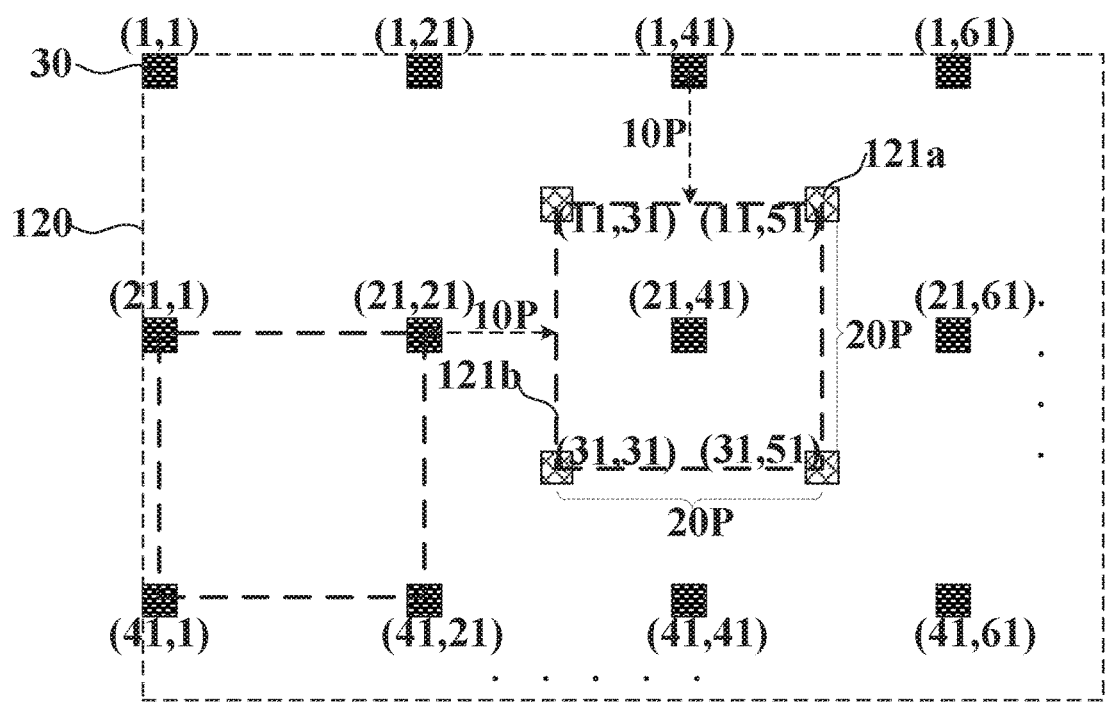
FIG. 21A is a schematic diagram showing a square array scanning mode of a display panel according to an embodiment of the disclosure.

For the square array scanning mode as shown in FIG. 21A, the coordinates of a lighted display unit 30 are provided by (row, column), and the coordinates of the first display unit 30 at the top left corner are (1,1). Thus, it may be known that, the coordinates of the display units 30 lighted in the first row are successively first row (1,1), (1,21), (1, 41), . . . , the coordinates of the display units 30 lighted in the second row are successively (21,1), (21,21), (21, 41), . . . , and the coordinates of the display units 30 lighted in the third row are successively (41,1), (41,21), (41, 41), . . . , and the like, which will be the coordinates of all the display units 30 lighted at the same time in one frame. The organic light emitting layer 120 of the display device will be divided horizontally and vertically by taking each lighted display units 30 as the center point. Then the organic light emitting layer 120 is divided into a plurality of lighted regions 121*b* that are totally the same, with the size of each lighted region 121*b* being totally consistent with others, and each lighted region 121*b* includes one lighted display unit 30 and a plurality of unlighted display units 121*a* surrounding the lighted display unit 30. It needs to be noted that, for a lighted display unit 30 located at the edge of the organic light emitting layer 120, the corresponding region thereof in the organic light emitting layer 120 is only a part of its lighted region.

For example, for the lighted display unit 30 (21,41), the lighted region 121*b* corresponding thereto is surrounded by four unlighted display units 121*a*, and the coordinates of the four unlighted display units 121*a* are respectively (11,31), (11,51), (31,31) and (31,51). Apparently, the length and width of the lighted region 121*b* are respectively 20P, that is, the number of display units forming the lighted region 121*b* is 20*20=400, and only one lighted display unit (21,41) exists in the lighted region 121*b*, that is, one display unit 30 is lighted in every 400 display units 30. Therefore, the density of lighted display unit in the lighted region 121*b* is 1/400. The organic light emitting layer 120 is divided into a plurality of lighted regions 121*b*, so that the density of lighted display units 30 in one frame of picture is 1/400. Thus, it may be known that, 20*20=400 frames of pictures need to be scanned to light all the display units 30 in the display device. FIG. 21A only shows a part of the display units 30 lighted at the same time and the coordinates thereof and unlighted display units 30*b* at the four vertexes of one lighted region 121*b* and the coordinates thereof.

Figure 21B:
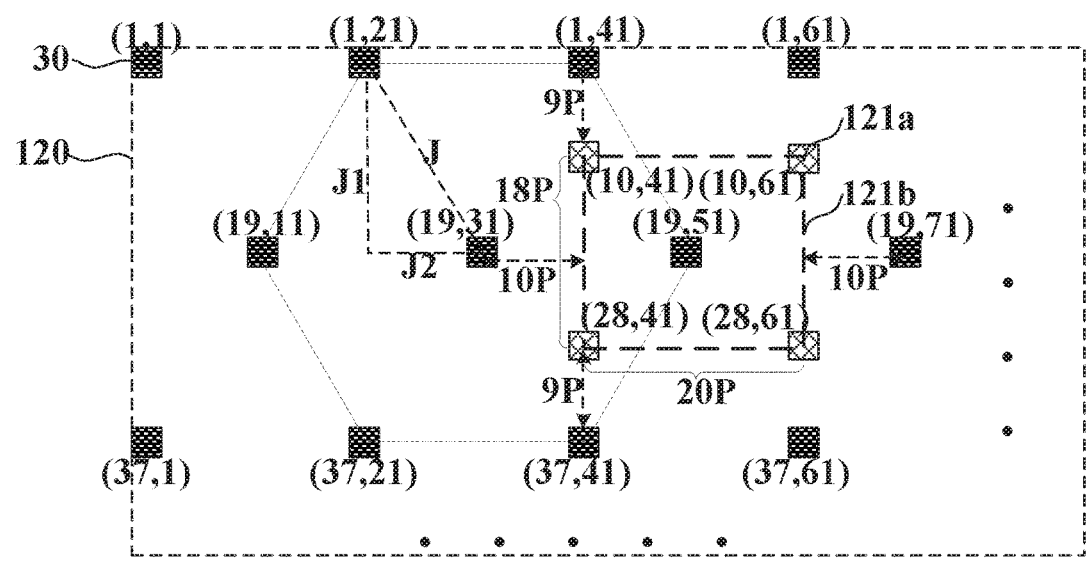
FIG. 21B is a schematic diagram showing a hexagonal array scanning mode of a display panel according to an embodiment of the disclosure.

For the hexagonal array scanning mode shown in As shown in FIG. 21B, the coordinates of a lighted display unit 30 are provided as (row, column), and the coordinates of the first display unit 30 at the top left corner are (1,1). In the hexagonal array, the distance J between any adjacent two lighted display units 30 can reach 20 display units 30 (20P), and the distance J1 from an edge display unit 30 located at a different row from the center display unit 30 to the row including the center display unit 30 may reach $10P\sqrt{3} \approx 18P$, and the distance J2 from an edge display unit 30 located at a different row from the center display unit 30 to the column including the center display unit 30 may reach 10P. Thus, it may be known that, the coordinates of the lighted display units 30 in the first row are successively (1,1), (1,21), (1, 41), . . . , the coordinates of the lighted display units 30 in the second row are successively (19,11), (19,31), (19, 51), . . . , and the coordinates of the lighted display units 30 in the third row are successively (37,1), (37,21), (37, 41), . . . , and the like, which will be the coordinates of all the display units 30 lighted at the same time in one frame. Apparently, when a display unit 30 is lighted, in the case that adjacent lighted display units 30 in each row are still spaced by 20P, the row space between different rows of lighted display units 30 is reduced from 20P to 18P. Then, the distance between an edge display unit 30 located at a different row from the center display unit 30 and the center display unit 30 is $\sqrt{(10P)^2+(18P)^2} \approx 20.59P > 20P$, which can meet the requirement of avoiding crosstalk.

The organic light emitting layer 120 of the display device will be divided horizontally and vertically by taking each lighted display units 30 as the center point, and the organic light emitting layer 120 is divided into a plurality of lighted regions 121*b* that are totally the same, the size of each of the lighted regions 121*b* is totally consistent with others, and each of the lighted regions 121*b* includes one lighted display unit 30 and a plurality of unlighted display units 121*a* surrounding the lighted display unit 30. It needs to be noted that, for a lighted display unit 30 located at the edge of the organic light emitting layer 120, the corresponding region thereof in the organic light emitting layer 120 is only a part of the region lighted by the display unit 30.

For example, for a lighted display unit 30 (19,51), the lighted region 121*b* corresponding thereto is surrounded by four unlighted display units 121*a*, the coordinates of which are (10,41), (10,61), (28,41) and (28,61), respectively. Apparently, the size of the lighted region 121*b* in the row direction is 20P, and the size thereof in the column direction is 18P, that is, the number of display units forming the lighted region 121*b* is 20*18=360. Only one lighted display unit (19,51) is present in the lighted region 121*b*, that is, there is one lighted display unit 30 for every 360 display units 30. Therefore, the density of lighted display units in the lighted region 121*b* is 1/360. The organic light emitting layer 120 is divided into a plurality of lighted regions 121*b*, so that the density of lighted display units 30 in one frame of picture is 1/360. Thereby, it may be known that, 20*18=360 frames of pictures need to be scanned to light all the display units 30 in the display device. FIG. 21B only shows a part of the display units 30 lighted at the same time and the coordinates thereof and unlighted display units at the four vertexes of one lighted region 121*b* and the coordinates thereof.

Apparently, the hexagonal array scanning mode shown in FIG. 21B outperforms the square array scanning mode shown in FIG. 21A.

Figure 22:
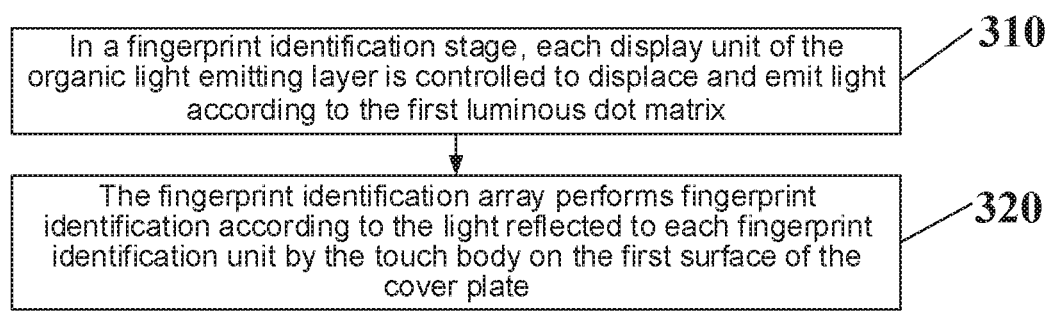
FIG. 22 is a flow chart of a fingerprint identification method for a display device according to another embodiment of the disclosure.

Another embodiment of the disclosure further provides a fingerprint identification method for a display device. As shown in FIG. 22, the fingerprint identification method according to this embodiment includes:

Step 310: In a fingerprint identification stage, each display unit of the organic light emitting layer is controlled to displace and emit light according to the first luminous dot matrix, wherein the distance between any adjacent two display units in the first luminous dot matrix is larger than or equal to the minimum crosstalk-free distance, wherein the minimum crosstalk-free distance is the maximum radius of the cover region formed on the fingerprint identification array by reflecting the light emitted from any display unit by the first surface of the cover plate.

Step 320: The fingerprint identification array performs fingerprint identification according to the light reflected to each fingerprint identification unit by the touch body on the first surface of the cover plate. In this embodiment, the touch body may be a finger of a user.

The display device according to this embodiment employs a picture scanning mode for fingerprint identification method, and each display unit in a picture displaces and emits light according to the first luminous dot matrix. On the basis that the distance between any adjacent two display units in the first luminous dot matrix is larger than or equal to the minimum crosstalk-free distance, the fingerprint reflection light formed by reflecting the light emitted from any display unit in the first luminous dot matrix by the fingerprint of the user finger will not irradiate on the fingerprint identification units corresponding to other display units in the same dot matrix, so that the fingerprint identification unit corresponding to each display unit in the first luminous dot matrix can only receive the fingerprint reflection light formed by the emergent light of the display unit corresponding thereto, that is, the fingerprint identification unit will not be affected by the crosstalk signals from other display units. Based on this, the inductive signal generate by the fingerprint identification unit accurately reflects the reflection of the emergent light of the corresponding display unit on the fingerprint of the user finger. Therefore, in the display device according to this embodiment, the precision of fingerprint identification can be improved.

Figure 23:
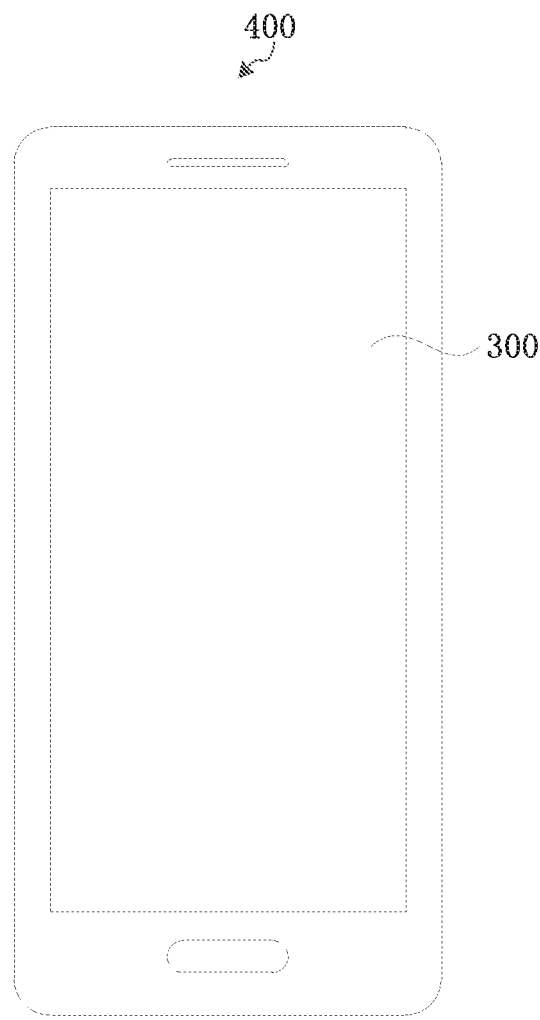
FIG. 23 is a structural representation of a display device according to an embodiment of the disclosure.

One embodiment of the disclosure further provides a display device. FIG. 23 is a structural representation of a display device according to an embodiment of the disclosure. Referring to FIG. 23, the display device 400 includes any display panel 300 according to the embodiments of the disclosure. Specifically, the display panel 300 may be a mobile phone, a tablet computer and an intelligent wearable device, etc.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. A display panel, comprising:
   an array substrate, which includes a base substrate and a display drive circuit formed on the base substrate;
   a display unit, which is provided on the array substrate and located on one side of the display drive circuit that is facing away from the base substrate; and
   a fingerprint identification unit, which includes a light-sensing unit, wherein the light-sensing unit is provided on the array substrate and located on one side of the display drive circuit that is facing away from the base substrate, and a vertical projection of the light-sensing unit on a plane including a light-emitting functional layer of the display unit is located between short edges of the light-emitting functional layers of adjacent display units,
   wherein a plurality of the display units is arranged successively along a first direction, and short edges of light-emitting functional layers of adjacent two rows of the display units arranged along the first direction are provided opposite to each other; and
   a vertical projection of the light-sensing unit on a plane including a light-emitting functional layer of the display unit is located between light-emitting functional layers of adjacent two rows of display units arranged along the first direction.

2. The display panel as claimed in claim 1, wherein:
   a shape of the light-emitting functional layer of the display unit is a rectangle.

3. The display panel as claimed in claim 1, further comprising:
   an encapsulation layer, which is provided on one side of the display unit that is facing away from the array substrate; and
   a support column, which is provided between the encapsulation layer and the array substrate, wherein a vertical projection of the support column on the array substrate is free of overlapping with a vertical projection of the light-sensing unit on the array substrate, or, a vertical projection of the light-sensing unit on the array substrate covers a vertical projection of the support column on the array substrate.

4. The display panel as claimed in claim 1, wherein:
   the display unit comprises a light-emitting functional layer, a first electrode and a reflection electrode, the light-emitting functional layer is provided between the first electrode and the reflection electrode, and the first electrode is provided on one side of the light-emitting functional layer that is facing away from the array substrate; and
   the light-sensing unit is provided between a film layer including the first electrode and the array substrate.

5. The display panel as claimed in claim 1, wherein:
   the display drive circuit comprises at least two first thin-film transistors and at least one capacitor.

6. The display panel as claimed in claim 5, wherein:
   the fingerprint identification unit further comprises a fingerprint identification circuit, which comprises a storage capacitor and a second thin-film transistor;
   a top electrode of the light-sensing unit is electrically connected with a first electrode of the storage capacitor, a bottom electrode of the light-sensing unit is electrically connected with a second electrode of the storage capacitor and a source electrode of the second thin-film transistor; a gate electrode of the second thin-film transistor is electrically connected with a switch control line, and a drain electrode of the second thin-film transistor is electrically connected with a signal detection line.

7. The display panel as claimed in claim 6, wherein:
   the second thin-film transistor is provided on the same layer as each film layer of the at least two first thin-film transistors of the display drive circuit.

8. The display panel as claimed in claim 6, wherein:
   the storage capacitor is provided on the same layer as each film layer of the at least one capacitor of the display drive circuit.

9. The display panel as claimed in claim 6, wherein:
   the light-sensing unit comprises a PIN junction located between the top electrode and the bottom electrode, the bottom electrode is a light-tight metallic layer, and the bottom electrode is located on one side of the PIN junction that is adjacent to the array substrate.

10. The display panel as claimed in claim 9, wherein:
    the storage capacitor is provided on the array substrate and located on one side of the display drive circuit that is facing away from the base substrate, and a vertical projection of the storage capacitor on a plane including a light-emitting functional layer of the display unit is located between light-emitting functional layers of adjacent display units.

11. The display panel as claimed in claim 10, wherein:
    the bottom electrode of the light-sensing unit is multiplexed as the second electrode of the storage capacitor, and the first electrode of the storage capacitor is provided on one side of the light-sensing unit that is adjacent to the array substrate.

12. The display panel as claimed in claim 11, wherein:
the first electrode of the storage capacitor is provided on the same layer as the reflection electrode of the display unit.

13. The display panel as claimed in claim 9, wherein:
a vertical projection of the PIN junction on the array substrate has a rectangle, a circle or an ellipse shape.

14. A display device, comprising a display panel which comprising:
an array substrate, which includes a base substrate and a display drive circuit formed on the base substrate;
a display unit, which is provided on the array substrate and located on one side of the display drive circuit that is facing away from the base substrate; and
a fingerprint identification unit, which includes a light-sensing unit, wherein the light-sensing unit is provided on the array substrate and located on one side of the display drive circuit that is facing away from the base substrate, and a vertical projection of the light-sensing unit on a plane including a light-emitting functional layer of the display unit is located between short edges of the light-emitting functional layers of adjacent display units,
wherein a plurality of the display units is arranged successively along a first direction, and short edges of light-emitting functional layers of adjacent two rows of the display units arranged along the first direction are provided opposite to each other, and
a vertical projection of the light-sensing unit on a plane including a light-emitting functional layer of the display unit is located between light-emitting functional layers of adjacent two rows of display units arranged along the first direction.

* * * * *